US010932392B2

(12) United States Patent
Gernert

(10) Patent No.: US 10,932,392 B2
(45) Date of Patent: Feb. 23, 2021

(54) VEHICLE THERMAL MANAGEMENT SYSTEM

(71) Applicant: Thermal Corp., Wilmington, DE (US)

(72) Inventor: Nelson Gernert, Elizabethtown, PA (US)

(73) Assignee: Aavid Thermal Corp., Wilmington, DE (US)

(*) Notice: Subject to any disclaimer, the term of this patent is extended or adjusted under 35 U.S.C. 154(b) by 57 days.

(21) Appl. No.: 16/291,823

(22) Filed: Mar. 4, 2019

(65) Prior Publication Data
US 2019/0297744 A1 Sep. 26, 2019

Related U.S. Application Data

(63) Continuation of application No. 14/928,650, filed on Oct. 30, 2015, now Pat. No. 10,225,953.

(60) Provisional application No. 62/097,820, filed on Dec. 30, 2014, provisional application No. 62/073,669, filed on Oct. 31, 2014.

(51) Int. Cl.
H05K 7/20 (2006.01)
H05K 1/02 (2006.01)
H01L 23/427 (2006.01)
H01L 23/433 (2006.01)
H01L 23/373 (2006.01)

(52) U.S. Cl.
CPC ..... H05K 7/20336 (2013.01); H01L 23/3733 (2013.01); H05K 7/2039 (2013.01); H01L 23/427 (2013.01); H01L 23/4332 (2013.01); H05K 1/0203 (2013.01)

(58) Field of Classification Search
CPC ............ H05K 7/2029; H05K 7/20336; H05K 1/0203; H01L 23/42; H01L 23/427–4275; H01L 23/4332–4334; H01L 23/473
See application file for complete search history.

(56) References Cited

U.S. PATENT DOCUMENTS

| 3,356,827 A | 12/1967 | Angelery |
| 3,791,326 A | 2/1974 | Schwarz |
| 3,934,208 A | 1/1976 | Getsinger et al. |
| 4,162,701 A | 7/1979 | Ollendorf |
| 4,594,858 A | 7/1986 | Shaw |
| 4,694,490 A | 9/1987 | Harvey et al. |
| 4,701,717 A | 10/1987 | Radermacher et al. |

(Continued)

FOREIGN PATENT DOCUMENTS

| CN | 101607604 A | 12/2009 |
| CN | 102092481 A | 6/2011 |

(Continued)

Primary Examiner — Zachary Pape
(74) Attorney, Agent, or Firm — Michael Best & Friedrich LLP

(57) ABSTRACT

A heat transfer system includes a heat source, a first heat exchanger coupled to the heat source to remove heat from the heat source, and a second heat exchanger coupled to the first heat exchanger to remove heat from the first heat exchanger. The heat transfer system also includes a thermal doubler coupled to the second heat exchanger to remove heat from the second heat exchanger, a first heat pipe coupled to the thermal doubler to remove heat from the thermal doubler, and a second heat pipe coupled to the first heat pipe to remove heat from the first heat pipe.

18 Claims, 17 Drawing Sheets

(56) References Cited

U.S. PATENT DOCUMENTS

| | | |
|---|---|---|
| 4,799,476 A | 1/1989 | McGrady |
| 4,880,050 A | 11/1989 | Nakamura et al. |
| 4,880,052 A | 11/1989 | Meyer, IV et al. |
| 4,899,810 A | 2/1990 | Fredley |
| 4,910,050 A | 3/1990 | Oldham et al. |
| 5,002,122 A | 3/1991 | Sarraf et al. |
| 5,127,554 A | 7/1992 | Loychuck |
| 5,148,860 A | 9/1992 | Bettini |
| 5,152,482 A | 10/1992 | Perkins et al. |
| 5,332,030 A | 7/1994 | Spencer et al. |
| 5,389,400 A | 2/1995 | Ting et al. |
| 5,421,540 A | 6/1995 | Ting |
| 5,527,001 A | 6/1996 | Stuart |
| 5,535,815 A | 7/1996 | Hyman |
| 5,647,429 A | 7/1997 | Oktay et al. |
| H001699 H | 12/1997 | Vavrick |
| 5,814,408 A | 9/1998 | Ting et al. |
| 5,871,859 A | 2/1999 | Parise |
| 6,003,817 A | 12/1999 | Basuthakur et al. |
| 6,033,506 A | 3/2000 | Klett |
| 6,037,909 A | 3/2000 | Cherrette |
| 6,061,243 A | 5/2000 | Barnett et al. |
| 6,073,887 A | 6/2000 | Hosick |
| 6,080,962 A | 6/2000 | Lee |
| 6,196,012 B1 | 3/2001 | Reason et al. |
| 6,230,790 B1 | 5/2001 | Hemingway et al. |
| 6,231,008 B1 | 5/2001 | Schwarting |
| 6,248,399 B1 | 6/2001 | Hehmann |
| 6,299,071 B1 | 10/2001 | Fiedrich |
| 6,428,890 B1 | 8/2002 | Ting |
| 6,626,231 B2 | 9/2003 | Cluzet et al. |
| 6,759,476 B1 | 7/2004 | Hayes |
| 6,830,221 B1 | 12/2004 | Janson et al. |
| 6,894,254 B2 | 5/2005 | Hauschulz |
| 6,952,530 B2 | 10/2005 | Helvajian et al. |
| 7,055,781 B2 | 6/2006 | Behrens et al. |
| 7,061,446 B1 | 6/2006 | Short, Jr. et al. |
| 7,150,938 B2 | 12/2006 | Munshi et al. |
| 7,191,984 B2 | 3/2007 | Barton et al. |
| 7,267,866 B2 | 9/2007 | Mase et al. |
| 7,478,782 B2 | 1/2009 | Huang et al. |
| 7,549,461 B2 | 6/2009 | Kroliczek et al. |
| 7,654,310 B2 | 2/2010 | Li |
| 7,708,053 B2 | 5/2010 | Kroliczek et al. |
| 7,742,306 B2 * | 6/2010 | Shuai .................... F21V 29/717 361/710 |
| 7,762,499 B1 | 7/2010 | Hentosh et al. |
| 7,967,256 B2 | 6/2011 | Wong |
| 8,042,606 B2 | 10/2011 | Batty et al. |
| 8,081,474 B1 * | 12/2011 | Zohni .................... H01L 23/367 361/719 |
| 2002/0119750 A1 | 8/2002 | Youssefi |
| 2003/0053298 A1 | 3/2003 | Yamada et al. |
| 2004/0233639 A1 | 11/2004 | Upadhya et al. |
| 2004/0240184 A1 | 12/2004 | Rivera |
| 2005/0002471 A1 | 1/2005 | Tramm et al. |
| 2005/0168941 A1 | 8/2005 | Sokol et al. |
| 2005/0201061 A1 | 9/2005 | Nikfar |
| 2006/0266496 A1 | 11/2006 | Edward et al. |
| 2007/0211431 A1 | 9/2007 | Munch et al. |
| 2007/0234741 A1 | 10/2007 | Lee et al. |
| 2007/0242438 A1 | 10/2007 | Belits et al. |
| 2008/0217483 A1 | 9/2008 | Hugon et al. |
| 2008/0218980 A1 * | 9/2008 | Tracewell .......... H05K 7/20672 361/713 |
| 2008/0245676 A1 | 10/2008 | McManus et al. |
| 2008/0285236 A1 | 11/2008 | Phillips et al. |
| 2009/0032218 A1 * | 2/2009 | Wayman ............. H05K 7/2049 165/80.3 |
| 2009/0126192 A1 | 5/2009 | Todd et al. |
| 2009/0288801 A1 | 11/2009 | Figus |
| 2009/0301601 A1 | 12/2009 | Enerson et al. |
| 2009/0314333 A1 | 12/2009 | Shepard |
| 2010/0214740 A1 | 8/2010 | Silverstein et al. |
| 2010/0223942 A1 | 9/2010 | Merino et al. |
| 2010/0319883 A1 | 12/2010 | Facusse |
| 2012/0024497 A1 | 2/2012 | Kroliczek et al. |
| 2012/0069526 A1 | 3/2012 | Tissot |
| 2012/0131932 A1 | 5/2012 | Kroliczek et al. |
| 2012/0203410 A1 | 8/2012 | Wechlin et al. |
| 2013/0014916 A1 | 1/2013 | Wadley et al. |
| 2013/0068891 A1 | 3/2013 | Hugon et al. |
| 2013/0083485 A1 | 4/2013 | Tong et al. |
| 2013/0306278 A1 | 11/2013 | Hoang |
| 2013/0322024 A1 * | 12/2013 | Tantolin ............. H05K 7/20672 361/721 |
| 2014/0111758 A1 | 4/2014 | Dunn et al. |
| 2014/0126142 A1 | 5/2014 | Dean et al. |
| 2014/0233174 A1 | 8/2014 | Demange |
| 2014/0251577 A1 * | 9/2014 | Connors .................. H01L 23/36 165/67 |
| 2015/0122454 A1 | 5/2015 | Houghton |
| 2015/0267966 A1 | 9/2015 | Lin et al. |
| 2015/0289406 A1 | 10/2015 | Coteus et al. |
| 2015/0327402 A1 | 11/2015 | Slippey et al. |
| 2015/0342097 A1 | 11/2015 | Koeppel et al. |
| 2016/0043017 A1 * | 2/2016 | Jones ................. H05K 7/20545 361/719 |
| 2017/0008367 A1 | 1/2017 | Cho et al. |
| 2017/0030655 A1 | 2/2017 | Hart |
| 2017/0164459 A1 | 6/2017 | Kim et al. |
| 2018/0195810 A1 | 7/2018 | Lyon |

FOREIGN PATENT DOCUMENTS

| | | |
|---|---|---|
| CN | 102092482 A | 6/2011 |
| CN | 103274061 A | 9/2013 |
| DE | 102011117133 A1 | 4/2013 |
| EP | 0454034 A1 | 10/1991 |
| EP | 2264317 A1 | 12/2010 |
| FR | 2850453 A1 | 7/2004 |
| GB | 655190 A | 7/1951 |
| GB | 1424383 A | 2/1976 |
| JP | S591993 A | 1/1984 |
| JP | S591994 A | 1/1984 |
| JP | H02102898 A | 4/1990 |
| JP | H02129000 A | 5/1990 |
| JP | H04163298 A | 6/1992 |
| JP | H05213295 A | 8/1993 |
| JP | H10209480 A | 8/1998 |
| JP | H11257884 A | 9/1999 |
| RU | 2067954 C1 | 10/1996 |
| RU | 2122166 C1 | 11/1998 |
| RU | 2123460 C1 | 12/1998 |
| RU | 2190189 C1 | 9/2002 |
| RU | 64819 U1 | 7/2007 |
| RU | 2007108169 A | 9/2008 |
| RU | 2341422 C2 | 12/2008 |
| RU | 2372258 C1 | 11/2009 |
| RU | 2401852 C2 | 10/2010 |
| RU | 2465181 C2 | 10/2012 |
| RU | 130299 U1 | 7/2013 |
| TW | 574283 B | 2/2004 |
| WO | 9618024 A1 | 6/1996 |

* cited by examiner

VEHICLE THERMAL MANAGEMENT SYSTEM

CROSS-REFERENCE TO RELATED APPLICATIONS

This application is a continuation of U.S. application Ser. No. 14/928,650, filed Oct. 30, 2015, which claims priority to U.S. Provisional Application No. 62/097,820, filed Dec. 30, 2014, and to U.S. Provisional Application No. 62/073,669, filed Oct. 31, 2014, the entire contents of each of which are incorporated herein by reference.

BACKGROUND

In many electronic systems on a vehicle, including those on spacecraft (e.g., satellites) or electric vehicles, the efficient cooling of electronic components and other heat sources has become a significant problem. With the advent of large-scale integrated circuit (IC) modules containing many thousands of circuit elements, it has become possible to pack large numbers of electronic components together within a very small volume. These integrated circuit modules generate significant amounts of heat during the course of their normal operation. Since most solid state devices are sensitive to excessive temperatures, a solution to the problem of the generation of heat by large scale IC's in close proximity to one another has become of increasing concern in the industry.

Current heat transfer systems have proven to be inadequate for removing the high levels of heat generated by heat sources such as ICs on spacecraft at a low enough thermal resistance and at a sufficiently fast rate. Thus, there has developed a need to more efficiently remove heat from electronics systems such as those on spacecraft.

SUMMARY

In accordance with some embodiments of the present invention, a heat transfer system includes a heat source, a first heat exchanger coupled to the heat source to remove heat from the heat source, a second heat exchanger coupled to the first heat exchanger to remove heat from the first heat exchanger, a thermal doubler coupled to the second heat exchanger to remove heat from the second heat exchanger, a first heat pipe coupled to the thermal doubler to remove heat from the thermal doubler, and a second heat pipe coupled to the first heat pipe to remove heat from the first heat pipe.

In accordance with other embodiments of the present invention, a heat transfer system includes a heat source, a plurality of copper-water heat pipes coupled to the heat source to remove heat from the heat source, a plurality of copper strips coupled to the copper-water heat pipes to remove heat from the copper-water heat pipes, a first heat exchanger coupled to the copper strips, an electronics chassis coupled to the first heat exchanger, and a second heat exchanger coupled to the electronics chassis. The second heat exchanger is selected from a group consisting of a thermal doubler and a thermal strap.

In accordance with still other embodiments of the present invention, a heat transfer system includes a first heat source, and a first heat exchanger coupled to the first heat source to remove heat from the first heat source. The first heat exchanger is selected from a group consisting of a copper-water heat pipe, a flexible heat pipe, a thermal strap, an encapsulated annealed pyrolytic graphite material, and an electronics chassis. The heat transfer system also includes a second heat exchanger coupled to the first heat exchanger to remove heat from the first heat exchanger. The second heat exchanger is selected from a group consisting of a copper-water heat pipe, a flexible heat pipe, a thermal strap, an encapsulated annealed pyrolytic graphite material, and an electronics chassis. The heat transfer system also includes a thermal doubler coupled to the second heat exchanger to remove heat from the second heat exchanger, and a first heat pipe coupled to the thermal doubler to remove heat from the thermal doubler. The first heat pipe is selected from a group consisting of a constant conductance heat pipe and a variable conductance heat pipe. The heat transfer system also includes a second heat pipe coupled to the first heat pipe to remove heat from the first heat pipe.

In accordance with still other embodiments of the present invention, a heat transfer system includes a deck having a first heat pipe, an electronics enclosure secured to the deck, a heat-generating electronics device located within the electronics enclosure, a second heat pipe establishing thermal transfer from the heat-generating electronics device and a wall of the electronics enclosure, and at least one of a third heat pipe, an encapsulated graphite material, a thermal doubler, and a thermal strap establishing heat transfer from the second heat pipe and the first heat pipe.

In accordance with still other embodiments of the present invention, a heat transfer system includes a deck having a first heat pipe, an electronics enclosure secured to the deck, a heat-generating electronics device located within the electronics enclosure, an encapsulated graphite material establishing thermal transfer from the heat-generating electronics device and a wall of the electronics enclosure, and at least one of a third heat pipe, the encapsulated graphite material, a thermal doubler, and a thermal strap establishing heat transfer from the electronics enclosure to the first heat pipe.

In accordance with still other embodiments of the present invention, a heat transfer system includes a first heat pipe having an evaporator that is elongated in a direction, and a second heat pipe that is elongated in the direction and that is in heat transfer relationship with the first heat pipe along a common length of the first and second heat pipes. The second heat pipe is shorter than the first heat pipe and is positioned to receive heat from a heat source that is localized to a fraction of the length of the second heat pipe, and to distribute the heat to a larger length of the first heat pipe.

In accordance with still other embodiments of the present invention, a heat transfer system includes a heat source, a first heat exchanger thermally coupled to the heat source to remove heat from the heat source, and a second heat exchanger thermally coupled to the first heat exchanger to remove heat from the first heat exchanger. The second heat exchanger includes an electronics chassis that defines an opening to receive the heat source. The heat transfer system also includes at least one heat transfer device coupled to at least one wall of the electronics chassis, the heat transfer device selected from the group consisting of a heat pipe and an annealed pyrolytic graphite material.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising" or "having" and variations thereof herein is meant to encompass the items listed thereafter and equivalents thereof as well as additional items. The terms "mounted," "connected" and "coupled" are used broadly and encompass both direct and indirect mounting, connecting and coupling. Further, "connected" and "coupled" are not restricted to physical or mechanical connections or couplings, and can include electrical connections or couplings, whether direct or indirect.

Figure 1:
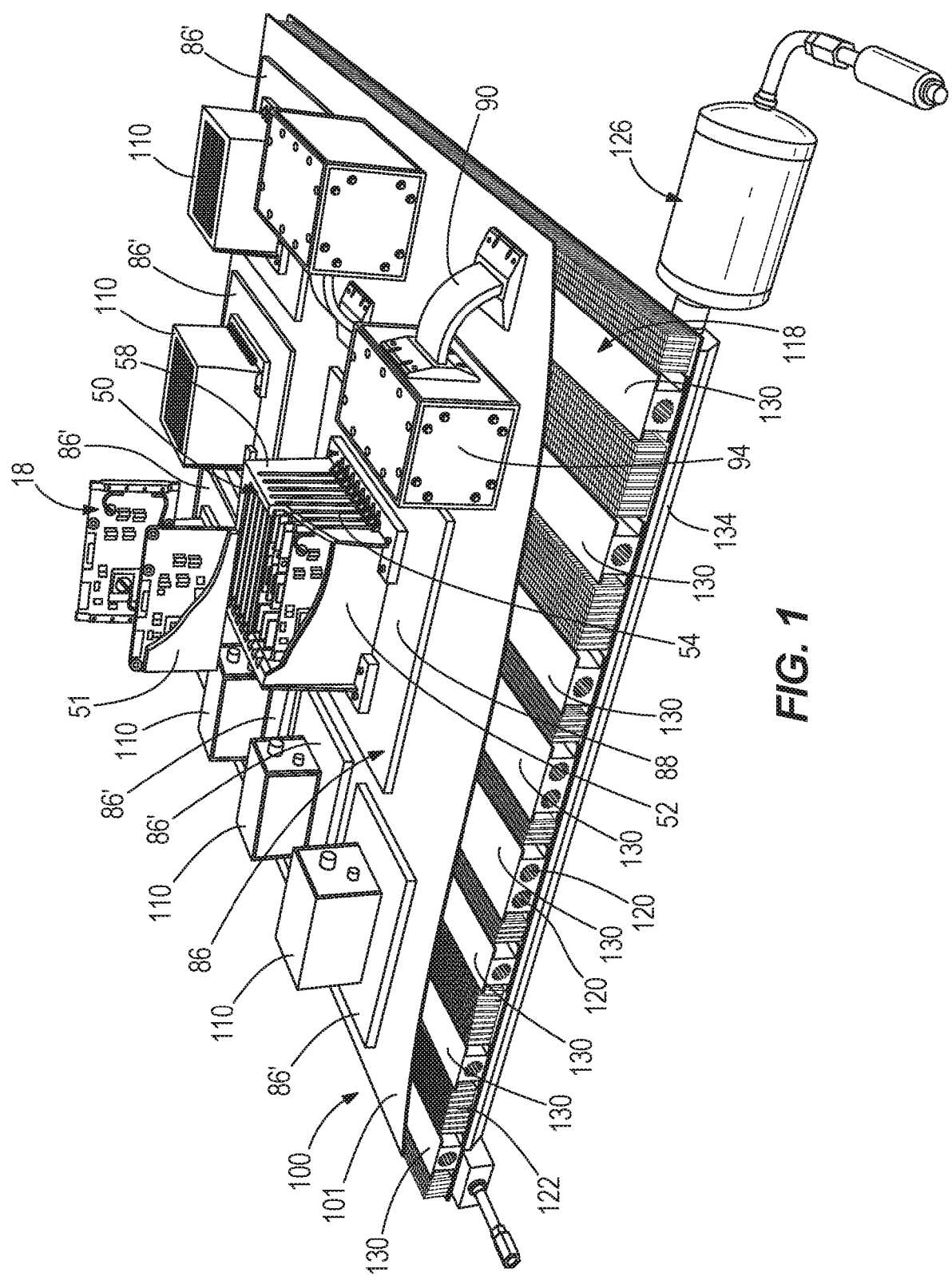
FIGS. 1, 1A, and 1B are perspective views of a heat transfer system for a spacecraft according to one embodiment.

FIG. 1 is a perspective view of a spacecraft 10 and a heat transfer system 14 disposed on the spacecraft 10. The heat transfer system 14 efficiently removes heat from one or more heat sources on the spacecraft 10 and delivers the heat away from the spacecraft 10.

While the description and illustrated embodiments herein are presented in the context of the invention as applied to a spacecraft, any or all of the aspects of the present invention can also be applied to any other vehicle (such as an electric vehicle).

For the particular embodiment in which the heat transfer system 14 is employed on a vehicle which operates in a wide range of temperatures (e.g. a spacecraft such as a satellite), measures may be taken to reduce stresses on electronics equipment that may arise due to substantial temperature changes that the equipment experiences. That is, the heat transfer system 14 is made more compliant, particularly in locations where the components of the heat transfer system 14 are in contact with electronics components. A vehicle such as a spacecraft may experience large temperature shifts depending on whether it is exposed to radiation such as sunlight or if it is shielded from radiation; in particular, spacecraft such as satellites orbiting the Earth may experience frequent large temperature changes as the satellite is alternately exposed to sunlight or is in the Earth's shadow. Components generally expand and contract as a result of the temperature swings and this expansion and contraction has the potential to cause damage to sensitive components such as electronics. Thus, in various embodiments the heat transfer system 14 includes elements designed to reduce or eliminate stresses on components (particularly electronics) from which heat is being removed. These elements may include the use of flexible heat straps, heat-conducting silicone gels, and flexible heat pipes (particularly heat pipes arranged in shapes that permit flexibility while maintaining heat-conducting properties), as disclosed herein. Some elements (e.g., loop heat pipe or other heat pipes) may include bellows 17, for example as illustrated in FIG. 3A, which aids in providing flexibility.

Figure 1A:
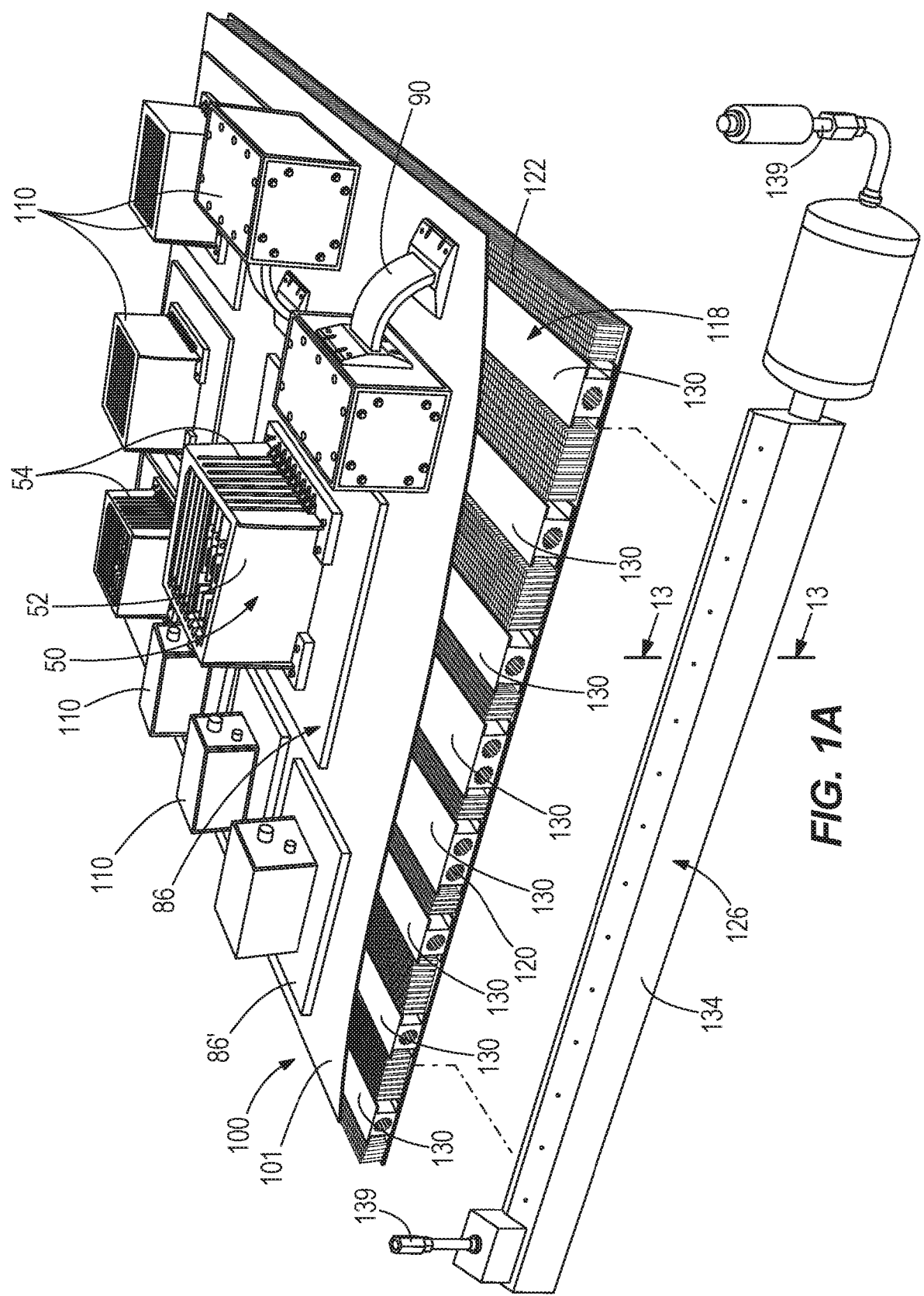
Figure 3:
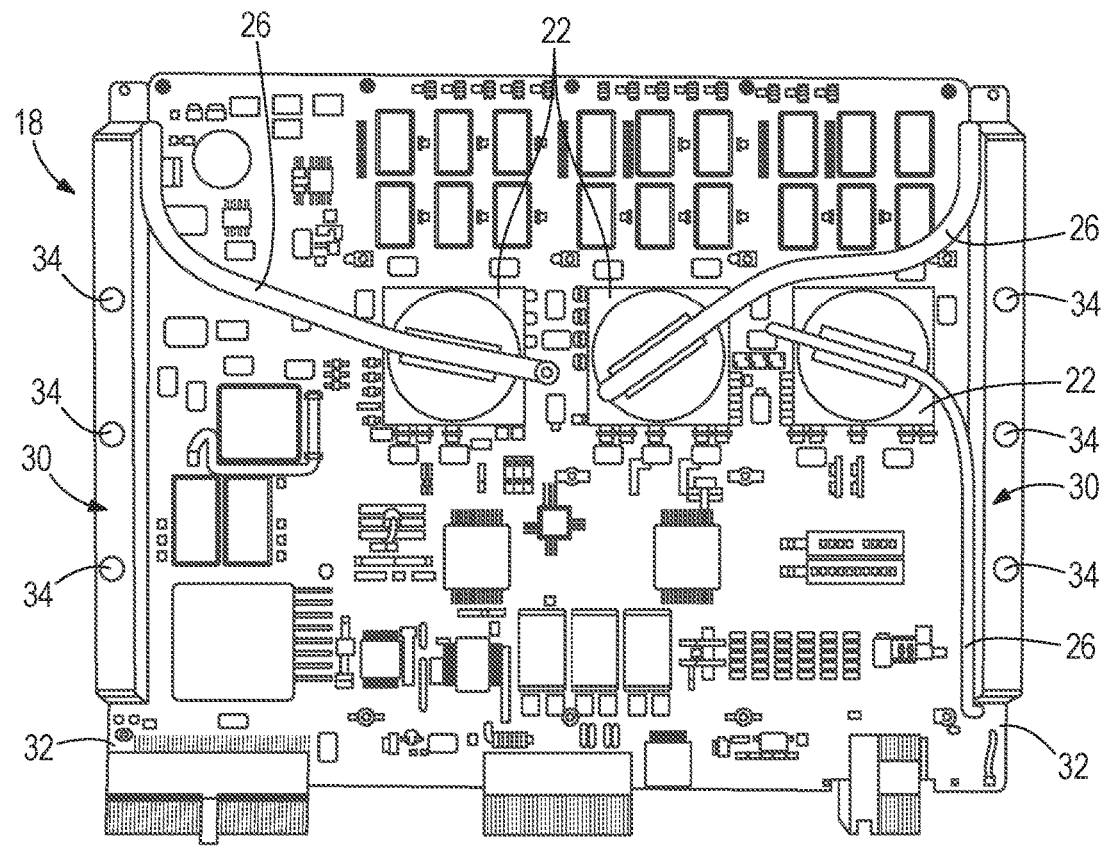
FIG. 3 is a perspective view of a circuit card module of the heat transfer system of FIG. 1, shown with heat pipes coupled to heat sources.
Figure 3A:
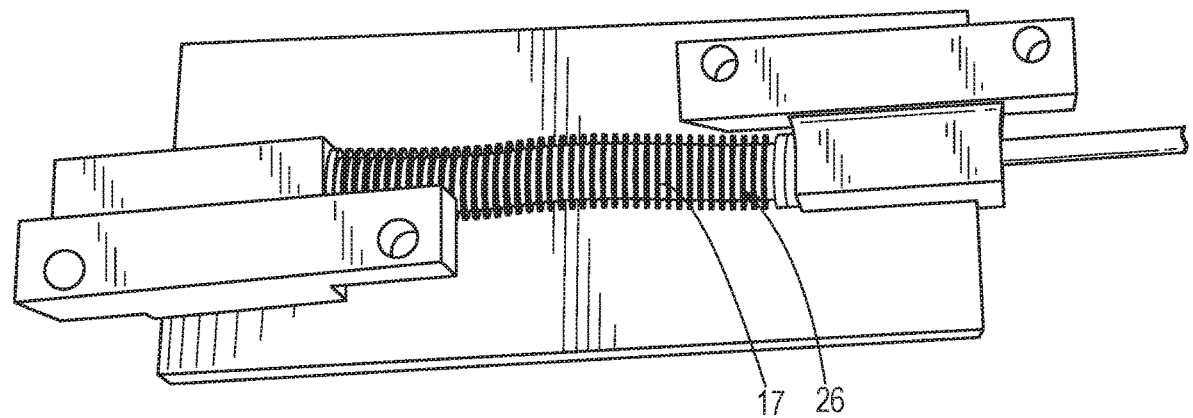
FIG. 3A is a perspective view of a heat pipe that includes a bellows to add flexibility to the heat pipe.

With reference to FIGS. 1, 1A, and 3, in the illustrated embodiment the heat transfer system 14 includes a plurality of circuit card modules 18 (e.g., card modules such as those used in military avionics meeting VME/VPX standards which may include one or more integrated circuits on a circuit board). As illustrated in FIG. 3, the circuit card modules 18 may include a plurality of heat sources 22, including, for example, processor chips, I/O modules, voltage regulators, power chips, other electronics, etc. that are mounted to the circuit card module 18.

Figure 5:
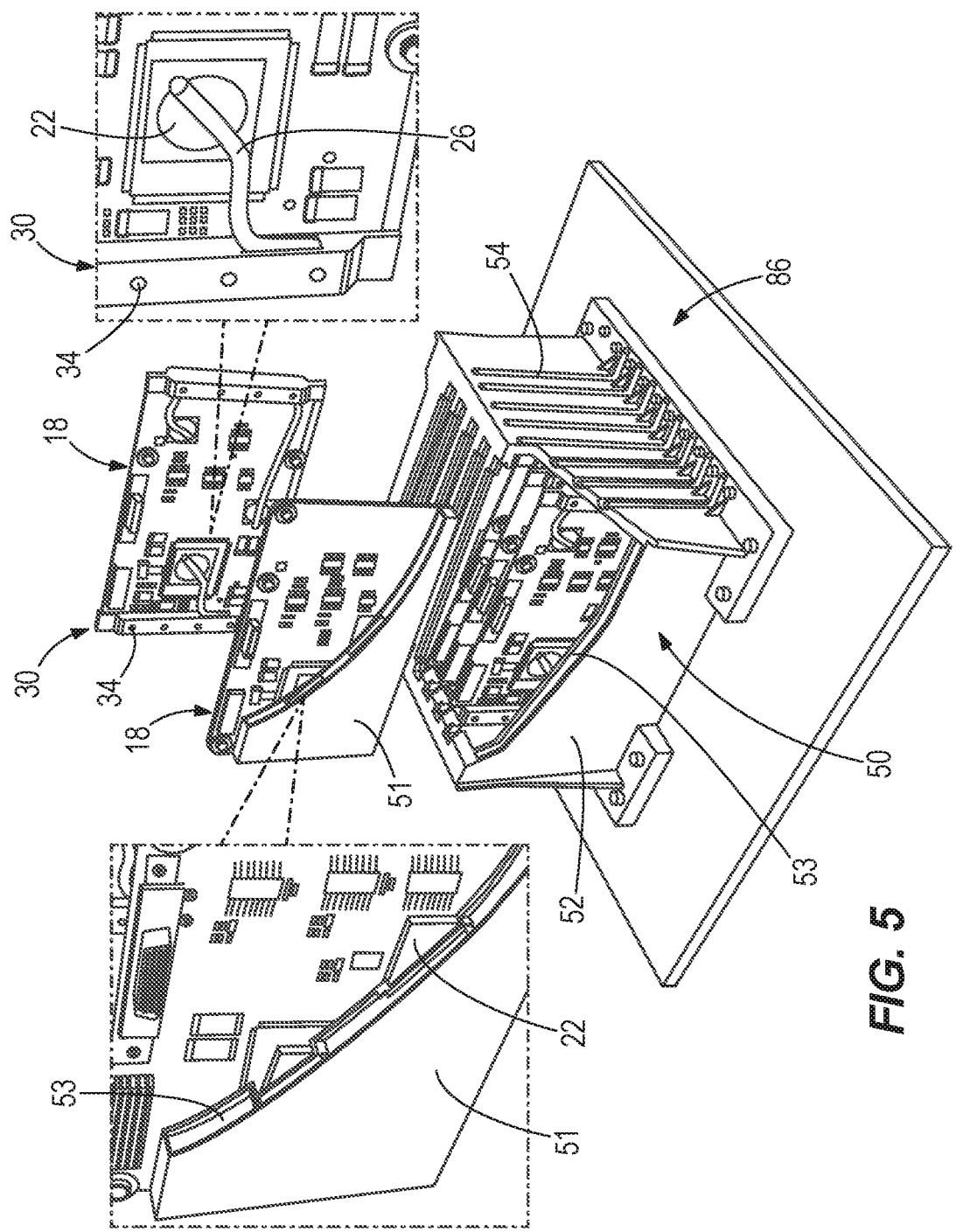
FIG. 5 is a perspective view of an electronics chassis of the heat transfer system of FIG. 1 that couples to the circuit card module and frame component of FIGS. 3 and 4.

The illustrated circuit card module 18 further includes a plurality of heat pipes 26 and two mounting components 30. The illustrated heat pipes 26 are copper-water heat pipes, although other embodiments may use different types of heat pipes and working fluids. In various embodiments, the heat pipes 26 are coupled to the heat source 22, for example with a compliant silicone gel or other suitable material, so that the connection between the heat source 22 and the heat pipes 26 is not stressed. The heat pipes 26 act as heat exchangers that extend from the heat sources 22 and direct heat away from the heat sources 22 and toward one or more edges of the card module 18 and/or to the mounting components 30 of the card module 18 (by which the card module 18 is releasably secured to an adjacent structure such as a frame, rack, receptacle, or other structure). With reference to FIG. 5, in some embodiments ends of the heat pipes 26 are wedged into or underneath the mounting components 30. In the illustrated constructions the heat pipes 26 are flexible and are arranged so as to include at least one bend (e.g. an "S" or "U" shaped bend), so that the heat pipes 26 can be bent and wedged in the manner shown in FIG. 5 to maintain thermal conductivity while also reducing stress on the heat sources 22.

With reference to FIGS. 3 and 5, in some embodiments the mounting components 30 provide a thermal connection to the adjacent structure. In the illustrated embodiment, each of the mounting components 30 includes a copper strip attached on or near an opposing edge 32 of the circuit card module 18 with three mounting apertures 34. Other embodiments may include different numbers and locations of mounting components 30 and apertures 34, and may include other materials instead of, or in addition to, copper.

As used herein, a heat exchanger refers to a device which transfers heat from one location to another, generally in an efficient manner and often incorporating a phase-change fluid (e.g. water, ammonia, Freon® (E.I. du Pont de Nemours and Company), acetone, ethane, ethanol, heptane, methanol, hydrocarbons, fluorocarbons, methyl chloride, NaK, carbon dioxide, methylamine, pentane, propylene; methane, oxygen, neon; hydrogen, liquid metals such as cesium, potassium, sodium, lead, lithium, mercury, rubidium, and silver, cryogenic fluids such as helium and nitrogen, and other fabricated or naturally-occurring working fluids). Many of these working fluids (e.g., helium, hydrogen, neon, oxygen, nitrogen, methane, ethane, propylene, pentane, methylamine, methanol, ammonia, carbon dioxide, acetone, and water) function in environments that have temperatures reaching as low as between approximately 0 degrees Celsius and −300 degrees Celsius. Heat exchangers are thermally coupled between a heat source and a heat sink (each of which may include another heat exchanger). Heat exchangers may spread heat in an approximately linear direction (e.g. as a heat pipe) or in a plane (as in a doubler or other plate-like device) or in other direction(s) as determined at least in part by the application. Depending on the particular application, heat exchangers may include but are not limited to heat pipes, thermosiphons, doublers, cold plates, plate-like devices (e.g., made of encapsulated annealed pyrolytic graphite material), electronics chassis (e.g., made of encapsulated annealed pyrolytic graphite material), and thermal straps.

The illustrated heat pipes 26 serve as passive, highly conductive two-phase heat exchangers. The heat pipes 26 are suitable for applications in which high heat loads and/or lack of gravity present thermal management challenges and where reliability and long life are critical. The insides of the heat pipes 26 may include wicking material, e.g. a sintered copper powder wick structure or other wick of the same or different material and/or structure, that operates to move fluid in low- or zero-gravity environments and which preferably is rugged enough to withstand numerous freeze-thaw cycles and temperature extremes ranging from −55° C. to 180° C. In some embodiments water is used as the working fluid. In these embodiments special precautions are used, particularly where the heat pipes 26 are sent into an extreme environment such as outer space. For example, in some embodiments a heat pipe fluid charge is managed (e.g., minimized) to prevent heat pipe wall breach and to keep the fluid contained in the wick since the presence of excess fluid could lead to rupture of the heat pipe. To manage or prevent freezing of a working fluid, a working fluid or mixture is chosen that does not freeze under defined operating conditions (e.g., large temperature ranges typically experienced in extreme environments such as outer space). In some embodiments such a working fluid or mixture includes, but is not limited to alcohol, acetone, or other materials such as.

In some embodiments which use water as the working fluid, the heat pipes 26 efficiently transfer heat from the heat sources 22 toward locations on the spacecraft 10 where the heat can be transferred to other structures and ultimately removed from the system, e.g. through dissipation (e.g. radiated to space).

Figure 4:
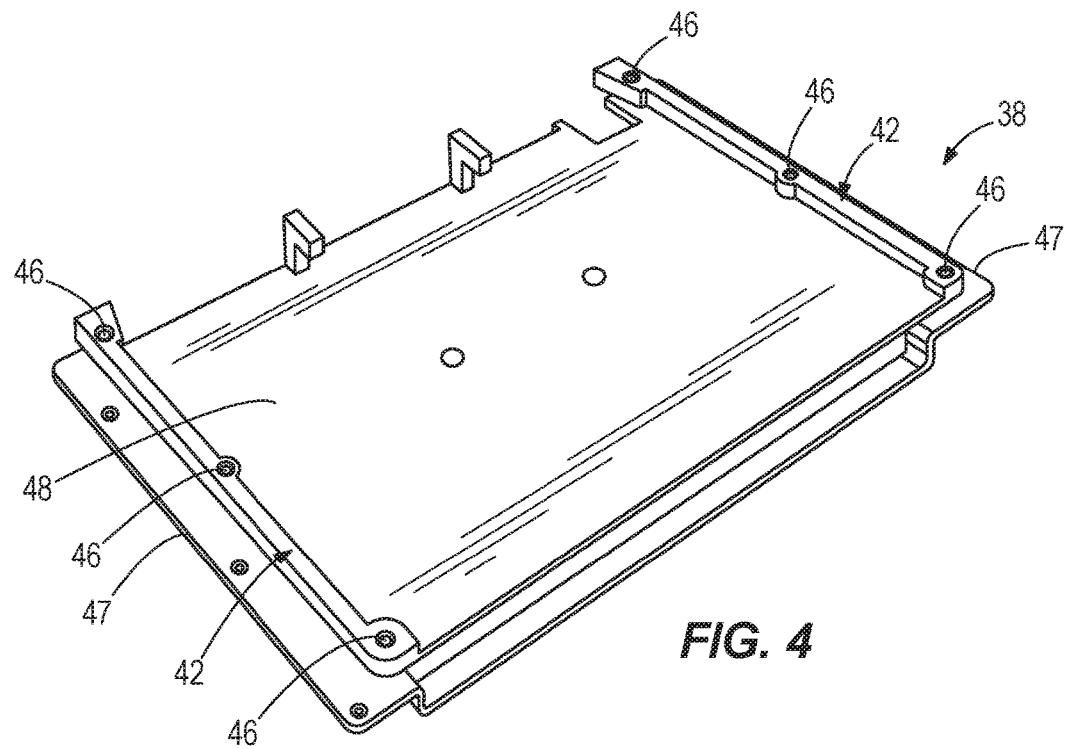
FIG. 4 is a perspective view of a frame component of the heat transfer system of FIG. 1 that couples to the circuit card module of FIG. 3.

With reference to FIGS. 1, 1A, and 4, in the illustrated construction the heat transfer system 14 further includes at least one frame component 38. The illustrated frame component 38 includes at least one elongate raised mounting component 42 with mounting apertures 46 that align with one or more of the mounting apertures 34 on the circuit card module 18. Fasteners (not shown) may be directed through the apertures 34, 46 to mount the frame component 38 to the circuit card module 18. Other embodiments include different numbers of mounting components 42 and mounting apertures 46, as well as different mounting structures for mounting the frame component 38 to the circuit card module 18. In the illustrated embodiment the mounting components 42 are disposed near edges 47 of the frame component 38.

The illustrated frame component 38 acts as a heat exchanger, and in some embodiments is made of an encapsulated graphite material. In some embodiments, the graphite material is an annealed pyrolytic graphite material (e.g., k-Core® material, available from Thermacore, Inc. of Lancaster, Pa. 17601), although other types of graphite material can instead be used. In other embodiments the frame component 38 may be made of other materials including copper or aluminum. Encapsulated graphite material (e.g., encapsulated annealed pyrolytic graphite material) helps to alleviate heat in high-power electronics for applications in aerospace, military and commercial applications, and can use such graphite material as an insert within an encapsulating structure, including but not limited to aluminum and copper alloys, ceramics, and composites. Encapsulated annealed pyrolytic graphite material is light in weight, and is highly thermally conductive. For example, in the illustrated embodiment, the frame component 38 is formed of encapsulated annealed pyrolytic graphite material that has three times the conductivity (k) of copper, but with the mass of aluminum.

With respect to the use of encapsulated annealed pyrolytic graphite in the frame component 38 as described above, the high thermal conductivity of such material occurs primarily in the lateral directions (i.e. generally along a planar surface 48 of the frame 38 between the mounting components 42 illustrated in FIG. 4), whereas thermal conductivity in the transverse direction (i.e., along a direction of a thickness of the frame 38 illustrated in FIG. 4) is significantly lower. Thus, the frame component 38 using such material takes the heat from the mounting components 30 of the circuit card module 18 and quickly spreads the heat laterally about the frame 38. In some embodiments the annealed pyrolytic graphite extends entirely or almost entirely to the edges 47 of the frame component 38.

In some embodiments the frame component 38 may be coupled to a circuit card module 18 that does not include heat pipes 26 and/or that does not include mounting components 30. For example, in some embodiments the frame component 38 (which may include encapsulated annealed pyrolytic graphite as described above) may be coupled directly to one or more of the heat sources 22 on one of the circuit card modules 18 and thereby both removes and efficiently spreads heat away from the heat source 22. In some embodiments the frame component 38 is not used at all, and instead the circuit card module or modules 18 are coupled directly to another heat exchanger.

With reference to FIGS. 1, 1A, and 5, in the illustrated embodiment the heat transfer system 14 further includes at least one electronics chassis 50. The electronics chassis 50 serves as a heat exchanger, and receives and houses the circuit card modules 18, and also houses one or more frame components 51. In the illustrated embodiment, the electronics chassis 50 is made of aluminum, and includes walls 52 with a layer or layers 53 (FIG. 5) of graphite material embedded therein (e.g., an annealed pyrolytic graphite material, such as that described above in connection with the frame component 38). In other embodiments other suitable materials are used. In various embodiments the card module 18 is coupled to the electronics chassis 50 via one or more of rails, wedges, locks, and clamps in a manner which facilitates heat transfer from the card module 18 to the chassis 50.

As illustrated in FIG. 5, the frame components 51 are similar to the frame components 38, but are specifically shaped and formed to match the changing contours of the electronic components (e.g., the card modules 18) and other sources of heat disposed within the chassis 50, such that the frame components 51 fit as close as possible to these sources of heat to pick up heat quickly and efficiently from within the chassis 50. The frame components 51 are coupled to the card modules 18 (e.g., with mounting apertures similar to mounting apertures 46, with compliant silicone gel, with a press fit, adhesive, fasteners, or with other mounting structures). In some embodiments, such as illustrated in FIG. 5, one or more of the card modules 18 coupled to a frame component 51 does not include the mounting components 30. In some embodiments the frame components 38 include a layer 53 of graphite material that facilitates heat transfer away from the card modules 18, such as to a thermal doubler 86 or to another heat exchanger. In some embodiments the electronics chassis 50 houses one or more of the frame components 38, one or more of the frame components 51, and one or more of the card modules 18.

With continued reference to FIGS. 1, 1A, and 5, the illustrated electronics chassis 50 includes a plurality of heat pipes 54 that extend along (e.g., are integral with) at least one side wall 58 of the electronics chassis 50 and direct heat away from one or more of the circuit card modules 18 and/or the frame components 38 toward a base of the chassis 50 and/or to the thermal doubler 86. The illustrated heat pipes 54 are copper-water heat pipes, similar to the heat pipes 26, although other embodiments use heat pipes being made of other materials and having other working fluids. In some embodiments heat is transferred from the frame component 38 and/or circuit card module 18 to the heat pipes 54 via solid conduction through a wall or walls of the electronics chassis 50. In some constructions, annealed pyrolytic graphite may be used in place of, or in conjunction with, the heat pipes 54 to direct heat away from the electronics chassis 50.

In some embodiments (e.g., where the electronics chassis 50 is made substantially or entirely of encapsulated annealed pyrolytic graphite material), the electronics chassis 50 does not include heat pipes 54, and instead relies on the high thermal conductivity of one or more sides or walls 52 of the electronics chassis 50 to spread and move heat away from the circuit card modules 18 and the frame components 38. In these and other embodiments, heat is transferred along one or more walls 52 of the electronics chassis 50 toward the thermal doubler 86 and/or heat pipes 118 to which the electronics chassis 50 is coupled and is in heat transfer relationship. This transfer of heat along the wall(s) of the electronics chassis 50 can be via conduction and in some embodiments can be enhanced by one or more heat exchangers mounted to the wall(s) of the electronics chassis 50 (e.g., encapsulated annealed pyrolytic graphite plates, heat pipes, and the like). In some embodiments a heat source, such as one of the heat sources 22, may be coupled directly to the electronics chassis 50, so as to pass heat directly into the electronics chassis 50.

Figure 5A:
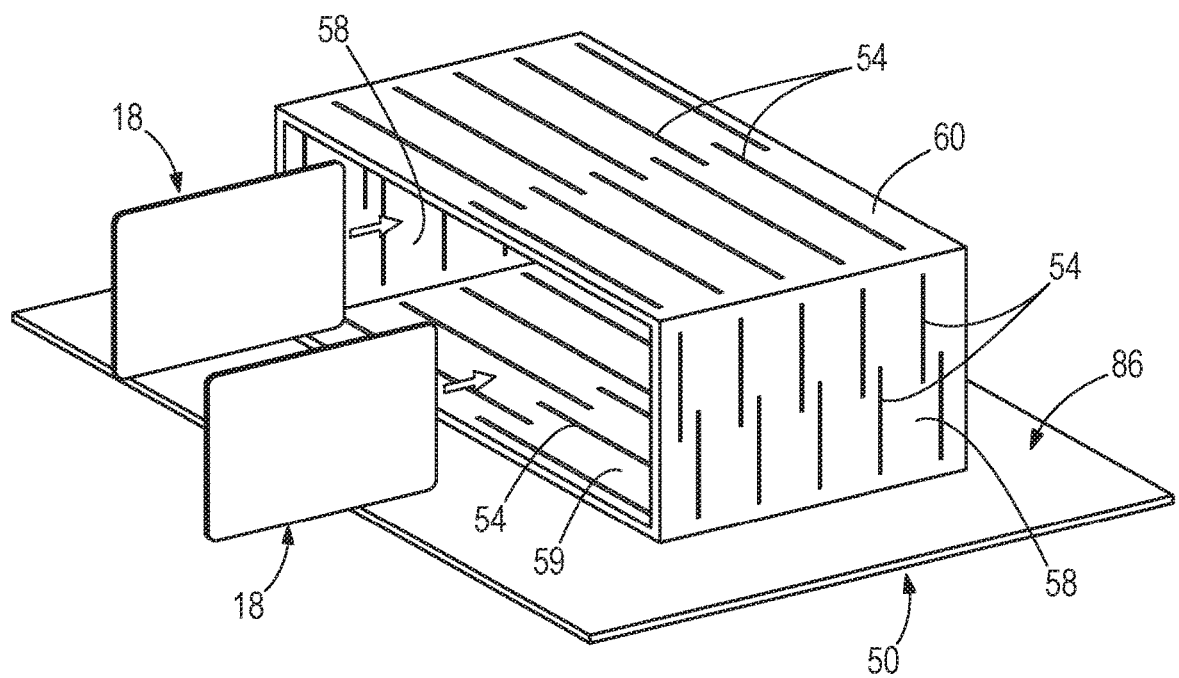
FIGS. 5A and 5B are perspective views of alternative embodiments of an electronics chassis.

With reference to FIG. 5A, in some embodiments the electronics chassis 50 includes one or more heat pipes 54 and/or annealed pyrolytic graphite disposed along and/or integrated into a bottom wall 59 of the electronics chassis 50, as well as along/integrated into one or more of the side walls 58 of the electronics chassis and a top wall 60 of the electronics chassis (if a top wall 60 is provided). Thus, the entire interior or substantially the entire interior of the electronics chassis 50 can serve as a heat exchanger to move heat from a heat source in the electronics chassis 50 to a location outside of the electronics chassis 50.

With continued reference to FIG. 5A, in some embodiments the card modules 18 are inserted horizontally into a side opening of the electronics chassis 50, rather than vertically down into the electronics chassis 50 as illustrated in FIG. 5.

Figure 5B:
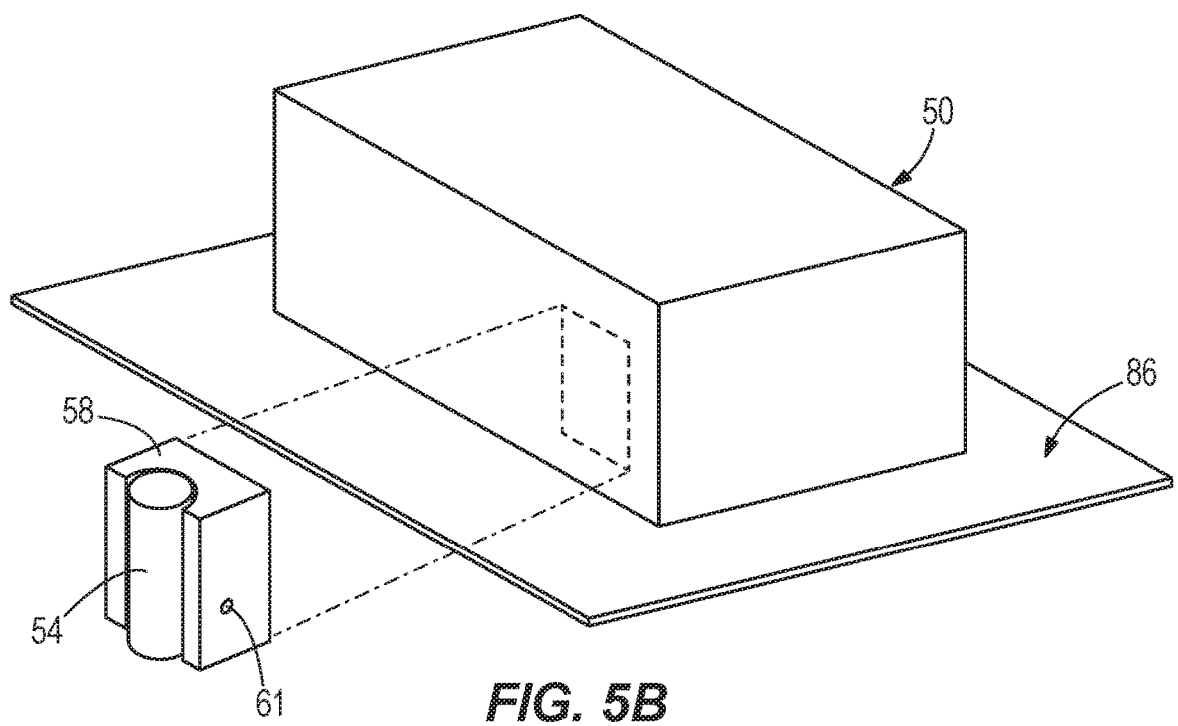

With reference to FIG. 5B, in some embodiments the heat pipes 54 are not integral with the electronics chassis 50, but rather are separate components which may be, for example, bolted with a bolt 61 (as illustrated in FIG. 5B) or strapped to the electronics chassis 50 or otherwise coupled to the electronics chassis 50.

Figure 6:
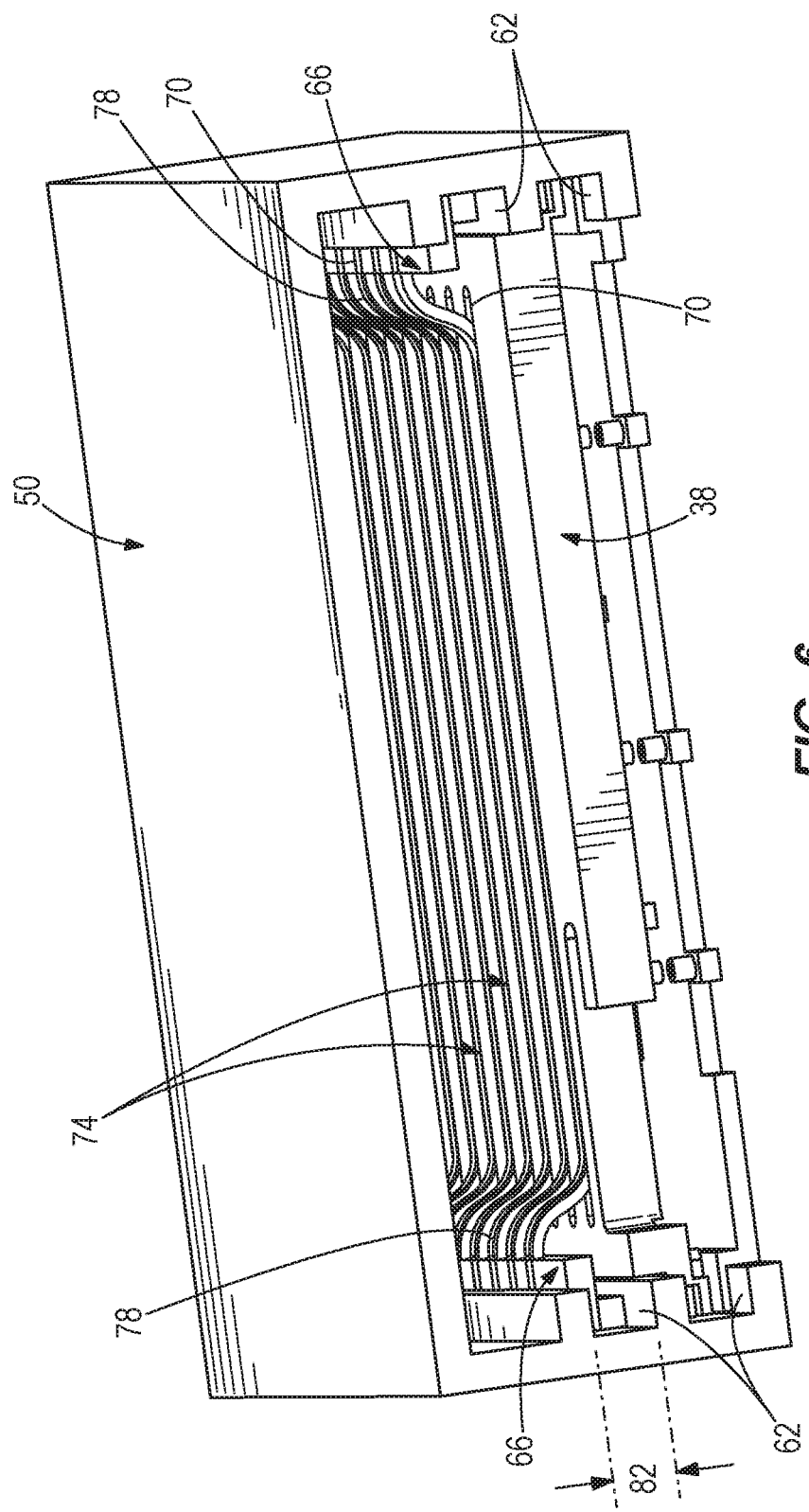
FIGS. 6 and 7 are perspective views of an electronics chassis and frame component according to another embodiment.
Figure 7:
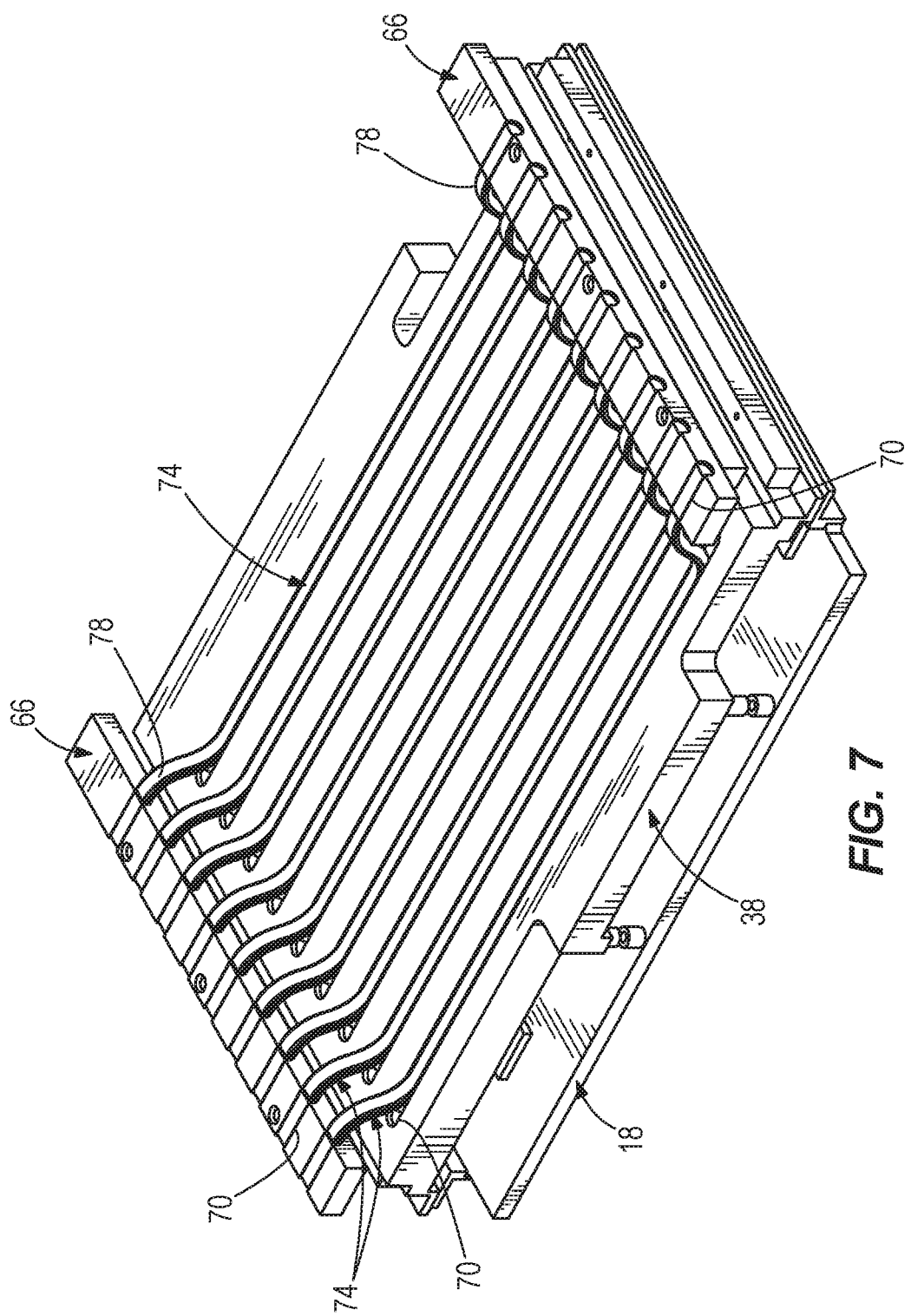

With reference to FIGS. 6 and 7, in some embodiments one or more of the electronics chassis 50 includes a plurality of interior slots 62 that are sized to receive edges of the frame component 38 (or similarly the frame component 51). In some embodiments, the frame component 38 can be provided with one or more thermally conductive rails 66 that are received within the internal slots 62 in addition to or instead of edges of the frame component 38 in order to transfer heat from the frame component 38 to the walls of the electronics chassis 50. For example, in the illustrated embodiment in FIGS. 6 and 7, the frame component 38 is made of encapsulated annealed pyrolytic graphite material, is coupled directly to one or more of the heat sources 22 on one of the circuit card modules 18 as described above, and is also coupled to a plurality of heat transfer rails 66. Each of the illustrated heat transfer rails 66, along with the frame component 38, includes a plurality of elongate grooves 70 that receive and are coupled to heat pipes 74. The heat pipes 74 extend along the frame 38, and are coupled at opposing ends 78 to the heat transfer rails 66. In some embodiments, the heat pipes 74 are copper-water heat pipes. The illustrated heat transfer rails 66 extend parallel to the frame component 38 at an offset distance 82 from adjacent edges of the frame component 38. In some embodiments, one or both of the frame component 38 and the heat transfer rails 66 include ribs or raised portions (not shown) for holding the heat pipes 74 in place. Also, in some embodiments, heat is primarily or exclusively transferred from the frame components 38 to one or more walls of the electronics chassis 50 by interfaces between edges of the frame components 38 and the walls of the electronics chassis 50 (e.g., via slots 62 as described herein).

With continued reference to the illustrated embodiment of FIGS. 6 and 7, the frame component 38 is insertable into the slots 62. The offset distance 82 is such that the heat transfer rails 66 are insertable into an adjacent slot 62 of the electronics chassis 50. In some embodiments the heat pipes 74 are flexible along the opposing ends 78 so that the heat transfer rails 66 may be adjusted spatially relative to the frame component 38 and moved into slots 66 that are either closer to or farther away from the frame component 38 (e.g., two slots 66 away from the frame component 38).

With continued reference to the illustrated embodiment of FIGS. 6 and 7, the heat transfer rails 66 facilitate heat removal by at least four slots 62 (two slots 62 on each side of the electronics chassis 50). In some embodiments, the frame component 38 and the heat transfer rails 66 are constructed from aluminum. In other embodiments, one or both of the frame component 38 and the heat-transfer rails 66 are made from other suitable heat-conducting materials (e.g., copper). In some embodiments, other heat transfer devices or heat exchangers (other than the heat pipes 74) are coupled between the frame component 38 and the heat transfer rails 66, if used.

Figure 7A:
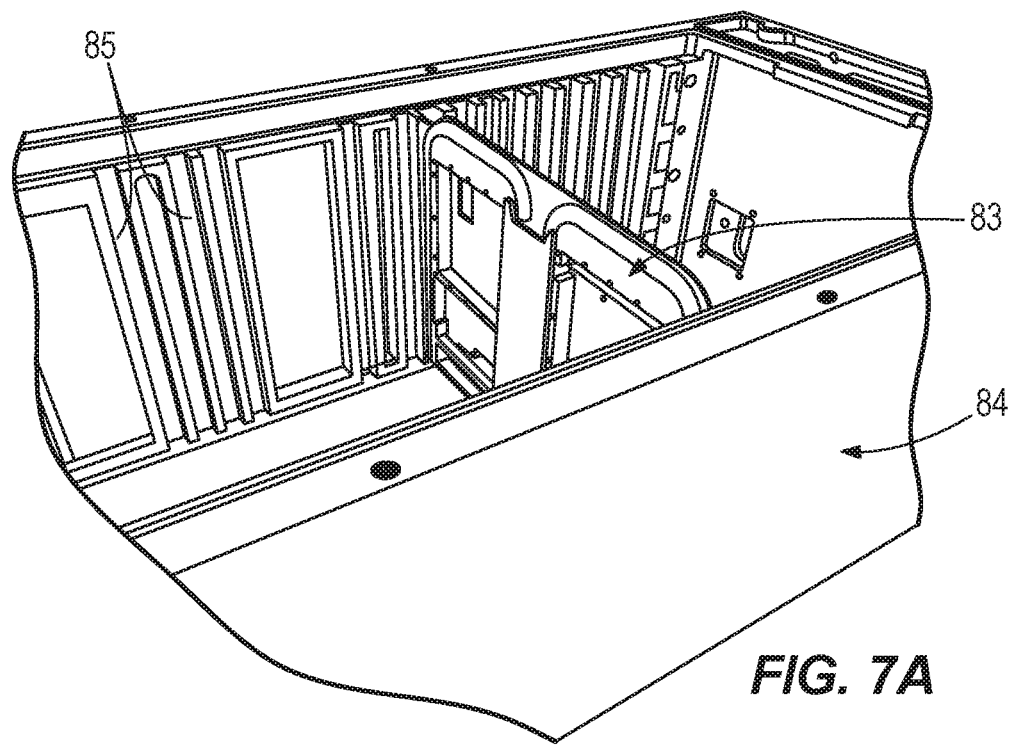
FIGS. 7A and 7B are perspective view of an electronics chassis and frame component according to another embodiment for use with the heat transfer system of FIG. 1.
Figure 7B:
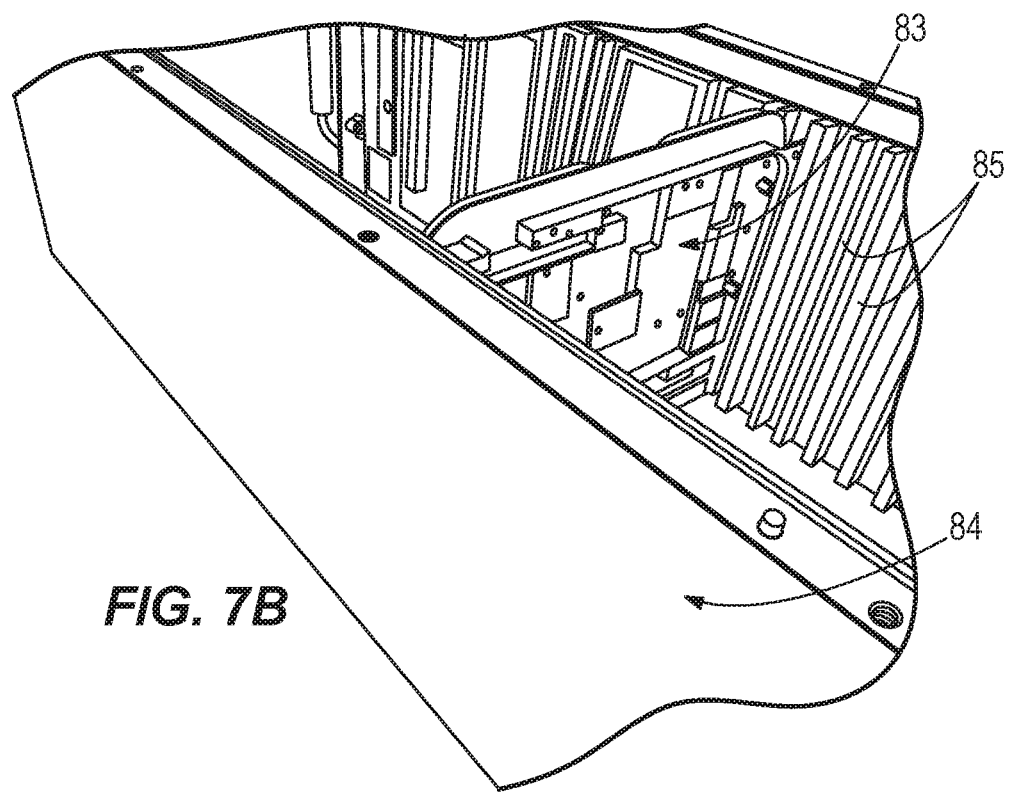

With reference to FIGS. 7A and 7B, in some embodiments one or more frame components 83 are provided to hold one or more circuit card modules (e.g., the circuit card modules 18) on the spacecraft 10. The frame components 83 are similar to the frame components 38 and 51. The frame components 83 operate as heat pipe cold plates, and are inserted into a chassis 84 (e.g., similar to the chassis 50) with slots 85 (e.g., similar to slots 62). The frame components 83 are held in place at least partially using one or more wedge locks (e.g., one or more wedge locks commercially available from Wakefield-Vette). The wedge locks slide between the frame components 83 and the chassis 84 within the slots 85, and when the wedge locks are tightened the wedge locks hold the frame components 83 in place. In the illustrated embodiment the frame components 83 are inserted into the chassis 84 vertically, although in other embodiments the frame components 83 are inserted from other directions (e.g., from the side).

Figure 8:
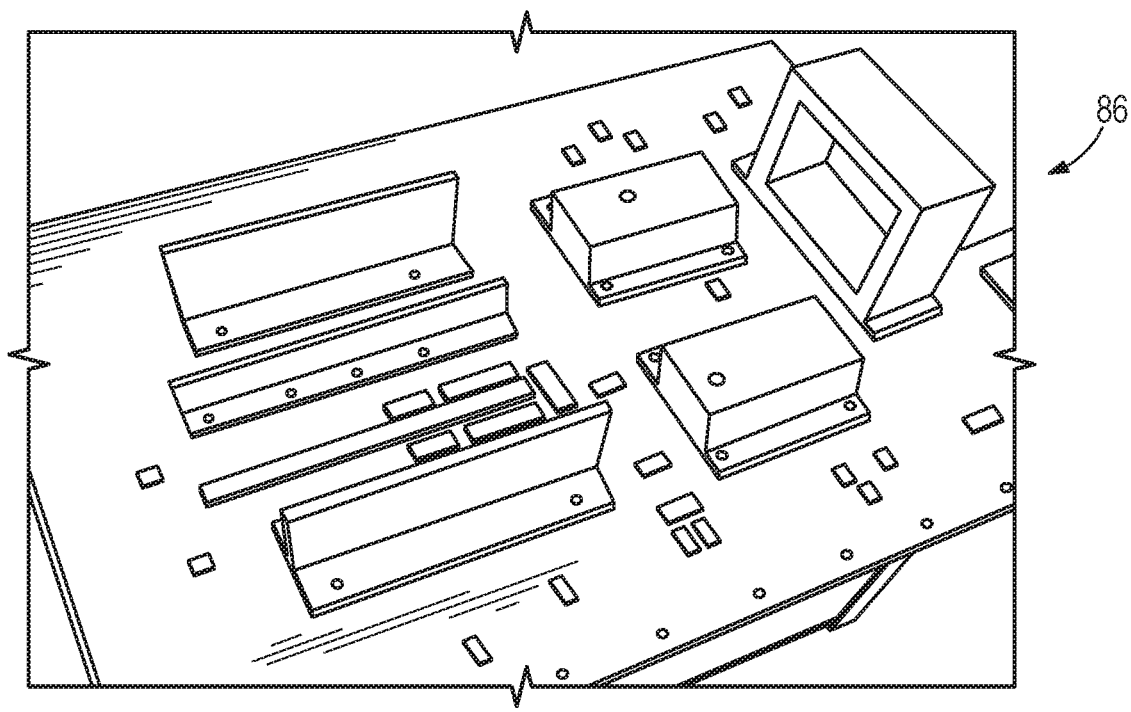
FIG. 8 is a perspective view of a thermal doubler of the heat transfer system of FIG. 1 that couples to the electronics chassis of FIG. 5.

With reference to FIGS. 1, 1A, and 8, in the illustrated embodiment the electronics chassis 50 is coupled to a thermal doubler 86. The thermal doubler 86 serves as a heat exchanger that conducts heat laterally (i.e., generally in a planar manner along the large, top planar surface 88 illustrated in FIG. 1). The thermal doubler 86 receives heat from the electronics chassis 50 (e.g., from the heat pipes 54 or from encapsulated graphite material and/or from any of the heat exchangers described above to enhance heat transfer from walls of the electronics chassis 50), and spreads the heat out along the thermal doubler 86. The illustrated thermal doubler 86 includes one or more plates of encapsulated annealed pyrolytic graphite material, although other embodiments include different types of material.

Figure 9:
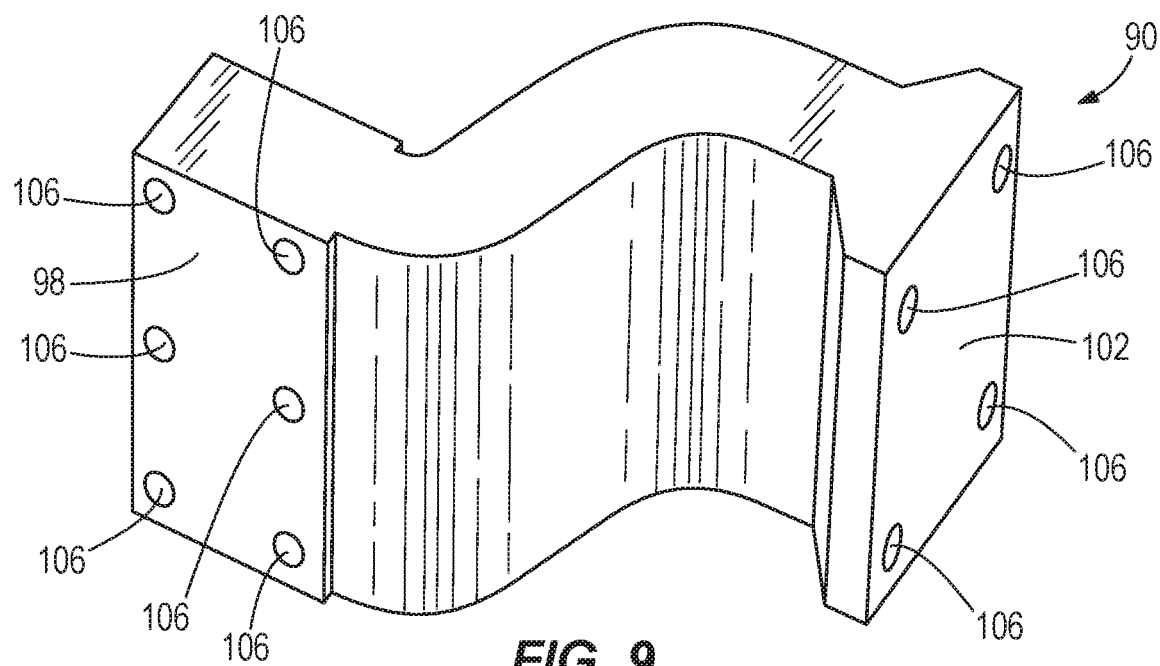
FIG. 9 is a perspective view of a thermal strap of the heat transfer system of FIG. 1 that couples to a heat source.
Figure 10:
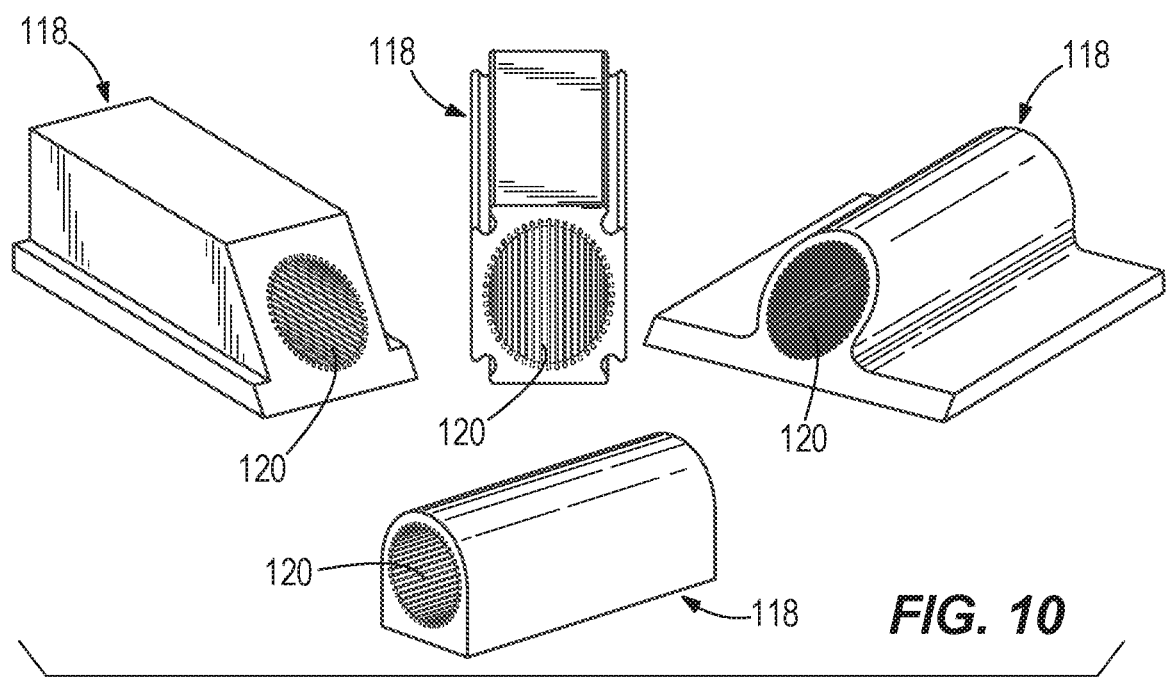
FIG. 10 is a perspective view of constant conductance heat pipes of the heat transfer system of FIG. 1 that couple to the thermal doubler of FIG. 8 and the thermal strap of FIG. 9.
Figure 11:
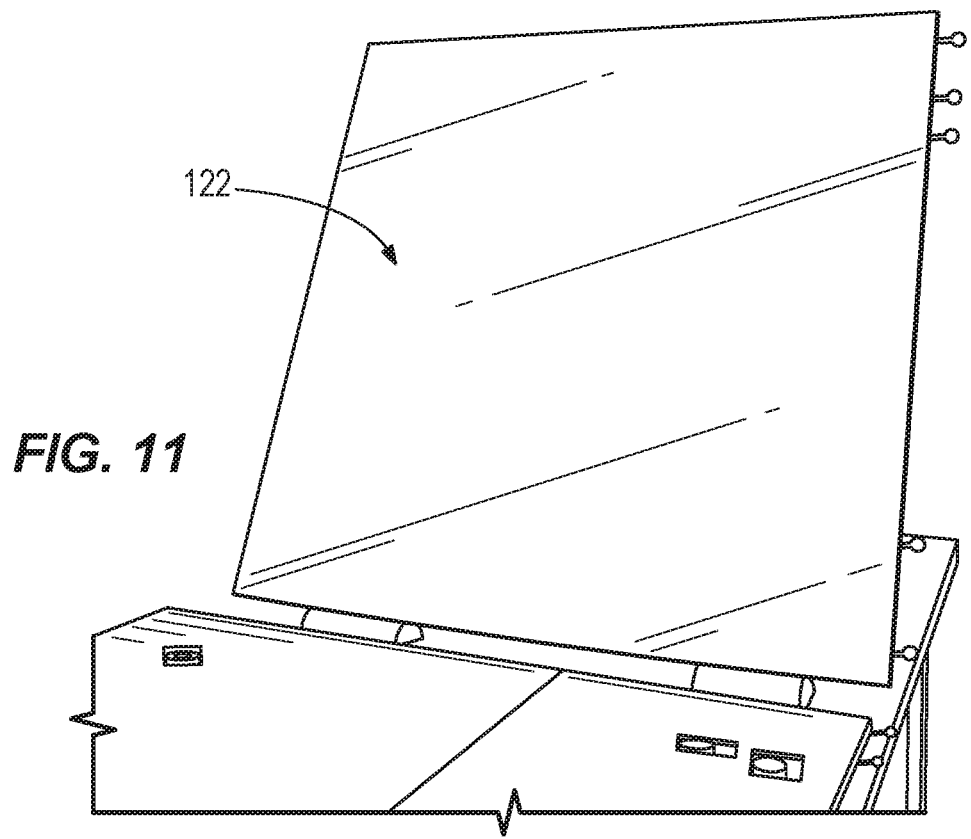
FIG. 11 is a perspective view of honeycomb panels that provide structure to the heat transfer system of FIG. 1.
Figure 12:
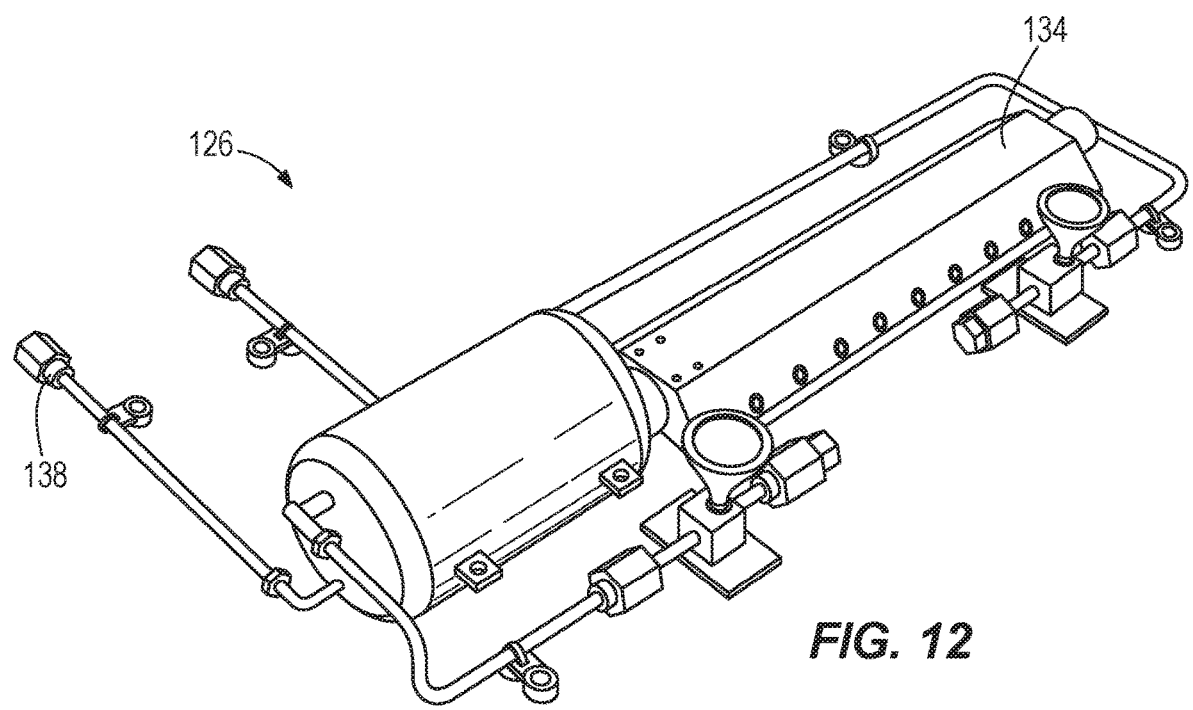
FIG. 12 is a perspective view of a closed loop heat pipe of the heat transfer system of FIG. 1 that couples to the constant conductance heat pipes of FIG. 10.

Certain embodiments of the heat transfer system 14 include a thermal strap 90. With reference to FIGS. 1 and 9, in the illustrated embodiment the heat transfer system 14 further includes at least one thermal strap 90, such that the thermal strap 90 functions as a heat exchanger. The illustrated thermal strap 90 is coupled to a heat source 94 spaced from the thermal doubler 86. The heat source 94 is any of a number of heat sources typically found on a spacecraft, such as a power inverter, printed circuit board, etc.

The illustrated flexible thermal strap 90 may include one or more flexible layers of copper sheeting material that direct heat from the heat source 94 laterally along the thermal strap 90 away from the heat source 94. In other embodiments, different materials may be used for the thermal strap 90, including aluminum, annealed pyrolytic graphite (e.g., k-Core®), or other graphite. The thermal strap 90 includes a first mounting end 98 and a second mounting end 102, with mounting apertures 106 for mounting the thermal strap to the heat source 94. The thermal strap 90 provides a natural conduction path for cooling without adding structural loads to spacecraft components. The thermal strap 90 is lighter in weight, smaller in size, and offers better conduction than some rigid, structural thermal heat transfer components. In some embodiments, thermal straps 90 are made by joining together a plurality of thin strips of material (e.g. copper or aluminum), such as by electron beam welding or resistance welding. At the first mounting end 98 and second mounting end 102, one or two additional thicker pieces of material (the same as or different from the material used for the strips) may be added on one or both sides of the stack of strips and/or capping the ends of the stack of strips to reinforce the stack of strips, protect the strips against stresses at the points of attachment, and facilitate attachment of the strap 90 to heat sources and/or heat exchangers. The additional pieces of material may be relatively flat and lay largely parallel to the strips, or may form a bracket that is approximately perpendicular to the long axes of the strips.

While the thermal strap 90 is illustrated only in the context of coupling to the heat source 94 as described above, in some embodiments the heat transfer system 14 also or alternatively utilizes one more thermal straps 90 to remove heat from the electronics chassis 50, from one of the frame components 38, from one of the circuit card modules 18, from the thermal doubler 86, and/or directly from one of the heat sources 22, all of which are described above. The flexibility of the thermal strap 90 makes it particularly suitable for removing heat from a component that is subject to mechanical stresses and/or moves relative to nearby structures, since heat can be transferred across a movable connection using the thermal strap 90.

In some embodiments, the heat source 94 is coupled to a thermal doubler 86 as described above, or is coupled to both a thermal doubler 86 and to one or more thermal straps 90. In some embodiments, the heat source 94 is also or instead coupled to heat pipes similar to heat pipes 26 and 54 to remove heat from the heat source 94 and transfer the heat to an underlying thermal doubler 86 and/or to underlying heat pipes 118 (described below).

With reference to FIGS. 1 and 1A, in the illustrated embodiment the heat transfer system 14 includes additional heat sources 110 (e.g., avionics boxes) spaced from the thermal doubler 86 and the heat sources 22 and 94. In some embodiments the additional heat sources 110 are made of different materials than the heat sources 22 or 94. In some embodiments the additional heat sources 110 are radiation hardened. The additional heat sources 110 are any of a number of heat sources typically found on a spacecraft, such as a power inverter, printed circuit board, etc. As illustrated in FIG. 1, any or all of the additional heat sources 110 can be coupled to their own, smaller thermal doublers 86'. The thermal doublers 86' are heat exchangers, similar to the thermal doubler 86. In some embodiments one or more of the thermal doublers 86' include one or more plates having graphite material (e.g., annealed pyrolytic graphite material). In some embodiments, the additional heat sources 110 are also, or alternatively, coupled to one or more thermal straps 90, to the thermal doubler 86, and/or to heat pipes similar to heat pipes 26 and 54.

In the illustrated embodiment of FIGS. 1, 1A, 1B, and 10, by way of example, the heat transfer system 14 includes a set of heat pipes 118 that are coupled to and receive heat from one or more of the thermal strap 90, the thermal doublers 86, 86', and the electronics chassis 50. In some embodiments one or more of the thermal doublers 86, 86' may be integrally formed with one or more of the closed loop heat pipes 118.

Figure 1B:
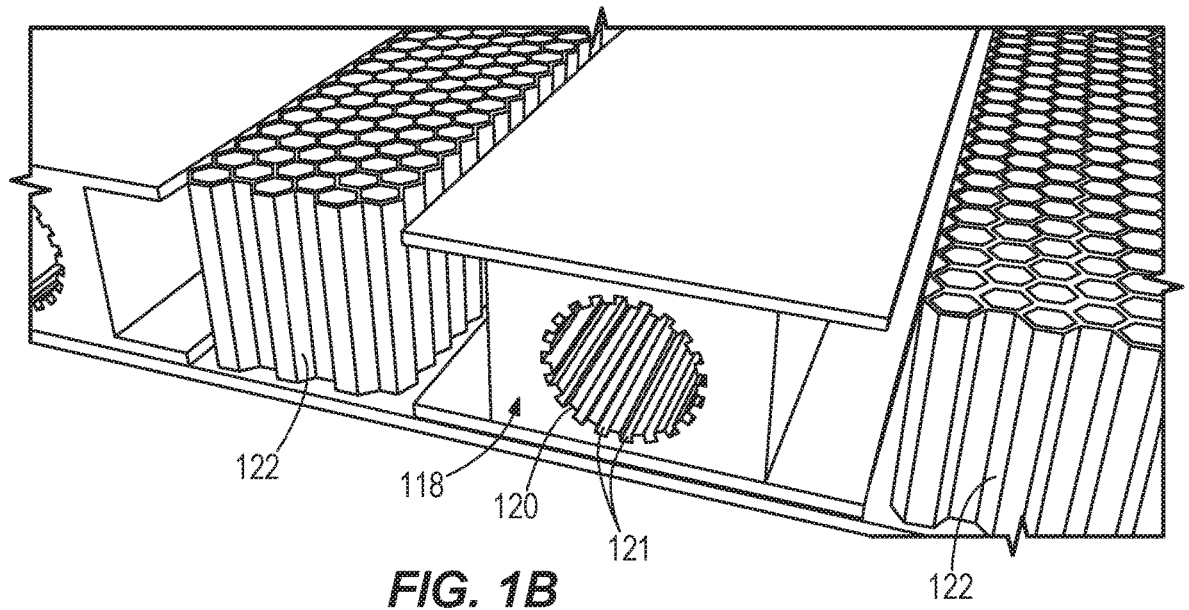

The illustrated heat pipes 118 are constant conductance heat pipes (CCHPs) that provide effective heat transfer (e.g., hundreds of watts or more) over long distances (e.g., up to three meters or more). The heat pipes 118 of the illustrated embodiment are of varying width. For example, some of the heat pipes 118 include two interior cavities 120 (double), whereas others include only one cavity 120 (single); in other embodiments additional interior cavities 120 (triple or greater) may be used as determined by the particular application. Thus, the number, heat load, and layout of heat sources will help determine the number and position of heat pipes 118 as well as whether single, double, or other arrangements of heat pipes are or can be used. In the illustrated embodiment the heat pipes 118 run parallel to one another below the heat strap 90 and the thermal doublers 86, 86', which are thermally coupled to the heat pipes 118. The heat pipes 118 house a working fluid (e.g., water, ammonia, etc.) that facilitates heat transfer within and along the heat pipes 118. In some embodiments the heat pipes 118 include wicking material inside the cavities 120 that facilitates capillary action to move the working fluid within and along the heat pipes 118 even in low- or zero-gravity environments. With reference to FIG. 1B, in some embodiments the heat pipes 118 include grooves 121 that provide capillary pumping and a high permeability flow path.

In some embodiments, one or more of the heat pipes 118 is a variable conductance heat pipe that uses a non-compressible gas and reservoir to passively maintain a temperature of one or more of the heat sources 22, 94, 98.

Some embodiments of the present invention employ a modular heat transfer deck 100 for supporting components of the heat transfer system 14 described herein. The heat transfer deck 100 includes a number of panels 122 (e.g., aluminum honeycomb panels) and a number of the heat pipes 118 secured to one another in a side-by-side relationship (e.g., with epoxy or low temperature solder), along with a high thermal conductivity face sheet 101 (e.g., made of aluminum, carbon fiber, honeycomb material, or other high thermal conductivity material) disposed above the panels 122 and pipes 118 that defines a deck surface. Certain components of the heat transfer system 14 (e.g., the thermal doubler 86 and heat strap 90) are mounted directly (e.g., with compliant silicone gel, adhesive, fasteners, etc.) to the face sheet 101, such that heat is transferred from the components of the heat transfer system 14 through the face sheet 101 and directly into the heat pipes 118 below. In some embodiments, the high thermal conductivity face sheet 101 is substantially flat and planar, such as that shown in FIG. 1. Also, in some embodiments, the panels 122 and the heat pipes 118 are elongated in shape, and extend in a substantially parallel manner across the deck 100 in a common direction. The panels 122 and the heat pipes 118 can be arranged to alternate across a dimension of the deck 100 (e.g., a width of the deck 100 as shown in FIG. 1), with any number of immediately adjacent panels 122 existing between pairs of heat pipes 118 and with any number of immediately adjacent heat pipes 118 existing between pairs of panels 122. In this manner, any number of electronics chassis 50 and other heat sources 94, 110 can be positioned across the length and width of the deck 100 relative to one another as desired, with underlying heat pipes 118 across a dimension of the deck 100 selected in dimension and number to cool the electronics chassis 50 and other heat sources 94, 110 without cooling the entire deck 100.

In the design of the heat transfer system 14, one or more electronics chassis 50 and/or one or more other heat sources 94, 110 are arranged as desired across the length and width of the deck 100. The heat pipes 118 are positioned so that at least one heat pipe 118 is in intersecting relationship with a footprint of each electronics chassis 50 and other heat source 94, 110 to establish heat transfer relationship between each electronics chassis 50 and other heat source 94, 110 and at least one heat pipe 118 so that the heat pipes 118 can thereby transfer heat from these components efficiently toward the edge(s) of the deck 100. As mentioned earlier, this arrangement of components allows the design of the deck 100 to be tailored to the particular arrangement of electronics chassis 50 and/or other heat sources 94, 110 without cooling the entire deck 100.

Although the number of heat pipes 118 between successive panels 122 and the number of panels 122 between successive heat pipes 118 can be increased and decreased to align the heat pipes 118 with the electronics chassis 50 and other heat sources 94, 110 across a dimension of the deck as just described, the width of the heat pipes 118 and/or the panels 122 can also or instead be increased and decreased across the same dimension to accomplish the same goal.

Furthermore, and as described above, the heat transfer system 14, including the deck or decks 100, may be used in conjunction not only with the spacecraft 10, but also with other vehicles including but not limited to an electric vehicle or any other vehicle that may benefit from the use of the heat transfer system 14.

Figure 2:
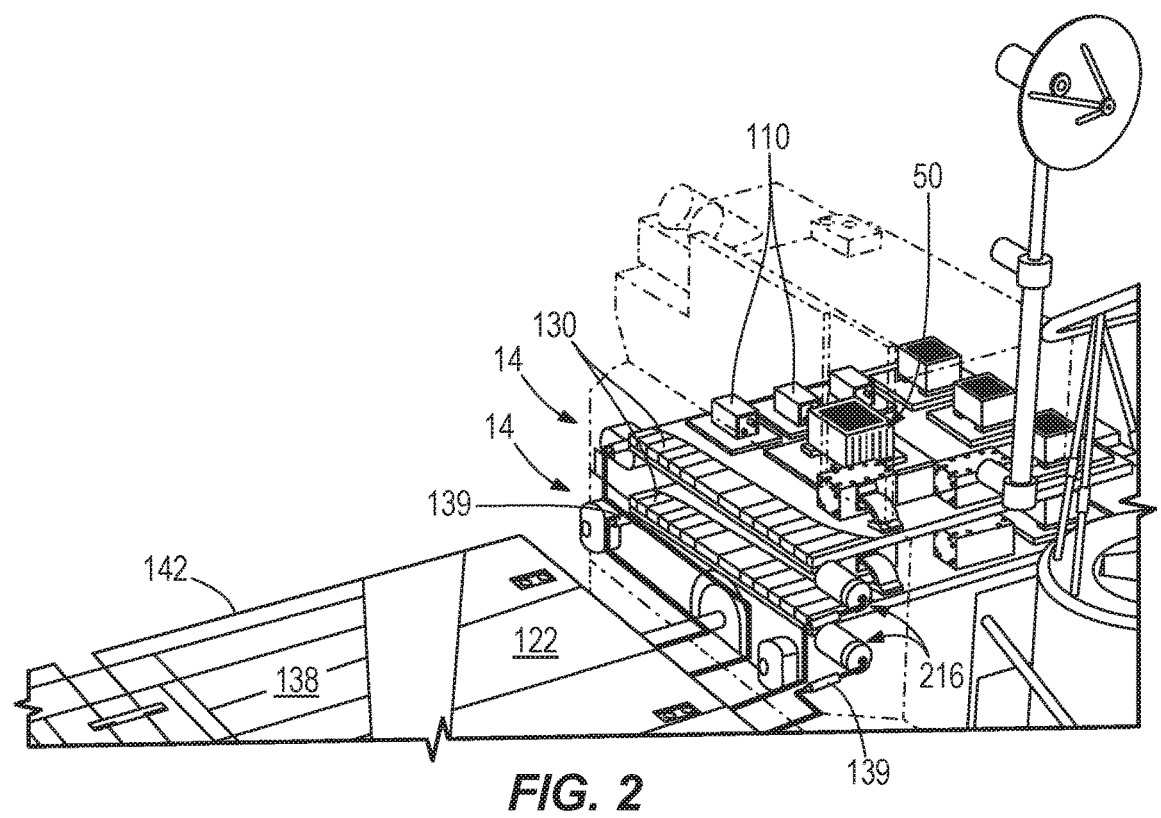
FIGS. 2 and 2A are perspective views of a portion of the spacecraft, including the heat transfer system shown in FIG. 1.
Figure 2A:
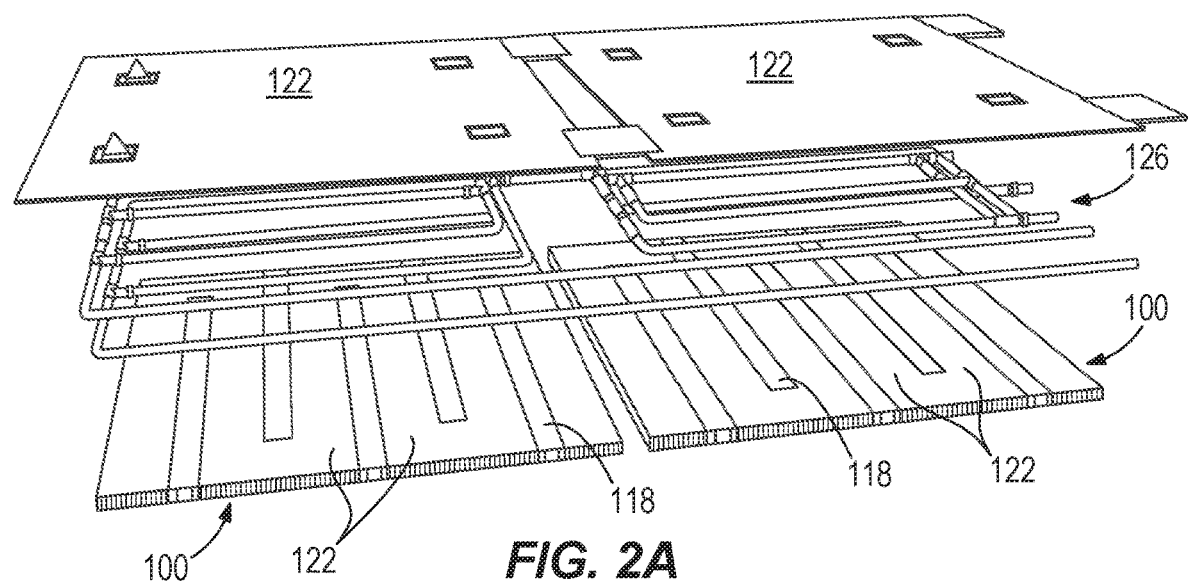

With reference to the illustrated embodiment of FIGS. 1, 1A, 1B, 2, 2A, and 11, the spacecraft 10 includes panels 122 as described above. Although the panels 122 can each be any preferably lightweight and substantially rigid structure, in some embodiments the panels 122 are made of a honeycomb structure. In the illustrated embodiment, honeycomb panels 122 are disposed between the heat pipes 118, and provide structural support for the heat transfer system 14. As illustrated in FIGS. 2 and 2A, the honeycomb panels 122 may also be used to provide structural support for portions of the spacecraft 10 spaced away from the heat pipes 118, for example in extensions of the spacecraft 10 that support solar panels.

With reference to FIGS. 1, 1A, 2, 2A, 12, and 13, the heat transfer system 14 further includes a closed loop heat pipe 126 that acts as a heat exchanger bus. The illustrated closed loop heat pipe 126 is coupled to and receives heat from ends 130 of the heat pipes 118. In the illustrated embodiment a working fluid (e.g., water, ammonia, etc.) is disposed within the loop heat pipe 126. The loop heat pipe 126 includes an evaporator section 134, a condenser section 138, and connectors 139 (FIGS. 1 and 2) that join the evaporator section 134 and the condenser section 138. The elongated evaporator section 134 runs perpendicular to the direction of the heat pipes 118 adjacent the ends 130 of the heat pipes 118 and panels 122. The evaporator section 134 is thermally coupled to the ends 130 of the heat pipes 118 and therefore heat is transferred from the heat pipes 118 to the evaporator section 134. The working fluid is vaporized in the evaporator section 134 by the heat from the heat pipes 118. With this relationship between the heat pipes 118 of the deck 100 and the loop heat pipe 126, heat originating from the various electronic chassis 50 and other heat sources 94, 110 distributed across the length and width of the deck 100 can be accumulated from multiple heat pipes 118 of the deck 100 to the evaporator section 134 of the loop heat pipe 126 for transfer of the heat away from the deck 100 toward the condenser section 138. Although a closed loop heat pipe 126 presents design and performance advantages in this function, it will be appreciated that the closed loop heat pipe 126 can be replaced by a standard (non-loop) heat pipe.

FIGS. 13A-D show various embodiments of cross-sections of the evaporator section 134, where the line 13-13 in FIG. 1A indicates a location for the cross-section of FIGS. 13 A-D.

Figure 13A:
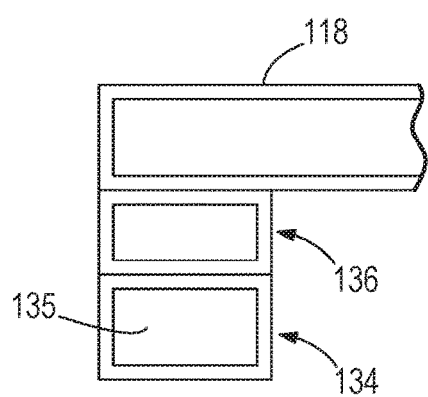
FIGS. 13A-G are cross-sectional and perspective views of embodiments of an evaporator section and flux transformers for a loop heat pipe for use in heat transfer systems of the present invention.
Figure 13B:
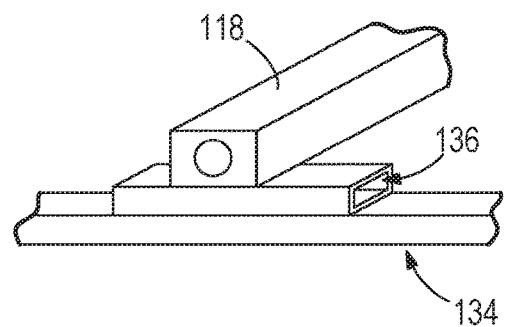

With reference to FIGS. 13A and 13B, in some embodiments the evaporator section 134 is disposed transverse to the end 130 of the pipe 118, and a separate flux transformer 136 device extends along a longitudinal direction of the evaporator section 134 (i.e., in the illustrated embodiment the direction that is transverse to the direction of the pipe 118) between the evaporator section 134 and the end 130 of a single pipe 118. The flux transformer 136 is any heat transfer element that spreads heat from a point heat source or other heat source (e.g., at the end of the pipe 118) along at least a portion of another structure (e.g., the evaporator section 134) before the heat enters an interior of that structure.

In some embodiments the flux transformer 136 is a heat pipe that extends along at least a portion of a common length of the evaporator section 134. In some embodiments the flux transformer 136 is shorter than the evaporator section 134 and is positioned to receive heat from a heat source (e.g., the end 130 of the heat pipe 118) that is localized to a fraction of the length of the flux transformer 136 and to distribute the heat to a larger length of the first heat pipe. In some embodiments the flux transformer 136 is equal to or longer than the evaporator section 134. In some embodiments the flux transformer 136 includes a graphite material (e.g., encapsulated annealed pyrolytic graphite material) or other suitable material. In the illustrated embodiment of FIGS. 13A and 13B the flux transformer 136 takes the heat from the end 130 of the pipe 118 and spreads the heat out along an extended portion of the evaporator section 134 before the heat enters the interior of the evaporator section 134.

Figure 13C:
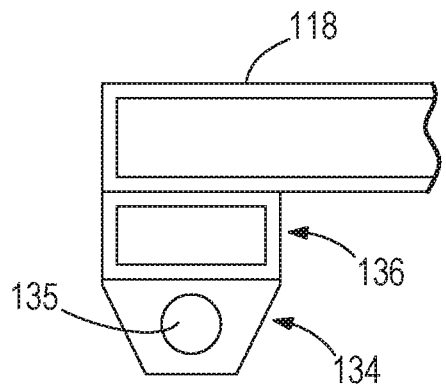
Figure 13D:
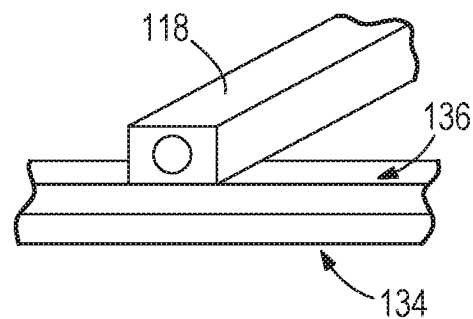

With reference to FIGS. 13C and 13D, in some embodiments the flux transformer 136 extends across the ends 130 of two or more pipes 118, so as to pick up heat off of the ends 130 of multiple pipes 118 and spread that heat along the longitudinal direction of the evaporator section 134 before the heat enters an interior of the evaporator section 134.

Figure 13E:
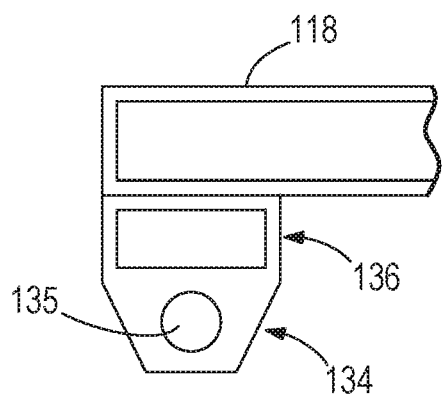
Figure 13F:
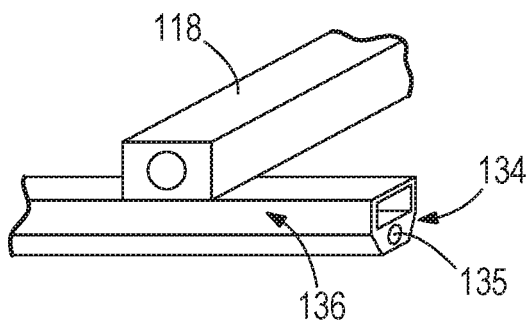

With reference to FIGS. 13E and 13F, in some embodiments the flux transformer 136 is integrally formed with the evaporator section 134 and extends across the end or ends 130 of one or more heat pipes 118.

Figure 13G:
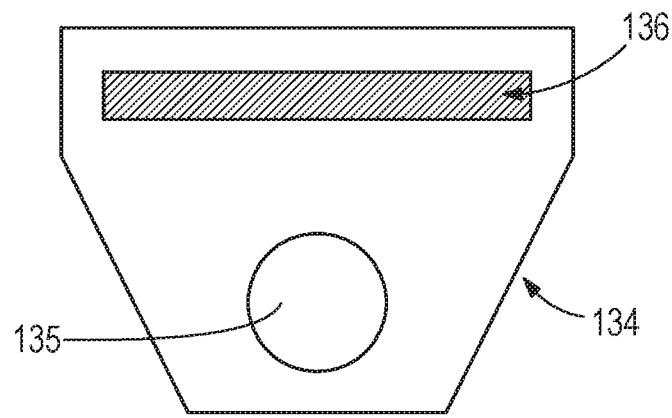

With reference to FIG. 13G, in some embodiments the evaporator section 134 is made of a thermally-conductive material (e.g. copper or aluminum) having an interior central cavity 135 which accommodates the evaporator tube of the loop heat pipe 126. In some embodiments, the central cavity 135 itself serves as the evaporator tube without a need to insert an evaporator tube into the cavity 135. In the illustrated embodiment of FIG. 13G, the evaporator section 134 includes a flux transformer 136 that is integrally formed in the evaporator section 134 above the cavity 135, and that spreads heat from the end or ends 130 of one or more heat pipes 118 along the longitudinal direction of the evaporator section 134 (i.e., along a direction transverse to the plane of the page containing FIG. 13G) before the heat enters the cavity 135. The flux transformer 136 spreads heat from concentrated, high-flux regions (e.g. the ends 130 of the heat pipes 118) over a larger area to more efficiently transfer the heat to the evaporator of a heat exchanger such as the loop heat pipe 126. In the illustrated embodiment the flux transformer 136 includes encapsulated graphite material (which can be annealed pyrolytic graphite material) to more efficiently distribute heat throughout the evaporator section 134. In yet other embodiments the flux transformer 136 includes liquid (e.g., water) or other material.

While each of the illustrated embodiments of FIGS. 13A-D includes specific numbers, geometries (e.g., lengths), shapes, and locations for the evaporator sections 134, the central cavities 135, and the flux transformers 136, it is understood that in other embodiments various other combinations of one or more of the evaporator sections 134, central cavities 135, and flux transformers 136 described above is possible, and that other numbers, geometries, shapes, and locations are also possible for these elements other than that illustrated. Additionally, in some embodiments the evaporator section 134 is not transverse to the ends 130 of the pipes 118 but is instead oriented at a different angle relative to the ends 130 of the pipes 118 (e.g., at approximately 80 degrees, 70 degrees, 60 degrees, 50 degrees, 40 degrees, 30 degrees, 20 degrees, 10 degrees, 0 degrees, etc.).

With reference to FIGS. 1, 1A, 2 and 2A, the loop heat pipe 126 conducts the heat from the heat pipes 118 from the evaporator section 134 to an exterior portion of the spacecraft 10 through vapor heat transfer. The vaporized fluid from the evaporator section 134 is received at the condenser section 138, which as illustrated in FIGS. 2 and 2A may be integrated into an extension 142 of the spacecraft (where the extension 142 may also include solar panels), whereupon the vaporized fluid is cooled and condensed into a liquid working fluid. The working fluid is then supplied in liquid form from the condenser section 138 to the evaporator section 134.

In some embodiments the loop heat pipe 126 includes a wick structure (not shown), for example in the condenser section 138, which uses capillary action (e.g., even in low- or zero-gravity environments) to facilitate return of the working fluid to the evaporator section 134, thereby completing a cycle within the loop heat pipe 126. The wick structure may be formed by materials and methods known to those skilled in the art so as to suitably provide a capillary action that returns the condensed working fluid to the evaporator section 134. For example, the wick may comprise a plurality of particles along with brazing compound that are brazed to the inside surfaces of the appropriate sections of the loop heat pipe 126. The particles may be made of any material having a high thermal conductivity and suitable for fabrication into a brazed porous structure, e.g., carbon, tungsten, copper, aluminum, magnesium, nickel, gold, silver, aluminum oxide, beryllium oxide, and the like.

In some embodiments the loop heat pipe 126 is a flexible loop thermosiphon having a flexible, hermetic, outer tube and a flexible, non-hermetic, inner tube, positioned concentrically within the outer tube, forming an annulus between the outer tube and inner tube. The annulus acts as a vapor conduit transferring vapor to the condenser section 138, while the inner tube acts as a condensate conduit returning liquid to the evaporator section 134. In this embodiment the loop heat pipe 126 permits relative motion between the evaporator section 134 and the condenser section 138 of the loop heat pipe 126 by employing a compact coaxial scheme for transport of vapor and condensate.

With reference to FIGS. 2 and 2A, in the illustrated embodiment the spacecraft 10 includes two heat transfer systems 14 stacked one above the other. Other embodiments include different numbers of heat transfer systems 14 (e.g., a single heat transfer system 14, or three or more heat transfer systems 14). In the illustrated embodiment each heat transfer system 14 includes a single loop heat pipe 126 (or a non-loop heat pipe in alternative embodiments as described above). However, in some embodiments one or more of the heat transfer systems 14 includes more than one loop heat pipe 126. For example, in some embodiments the heat transfer system 14 includes loop heat pipes 126 that receive heat from both ends of the heat pipes 118, including those opposite to the ends 130, such that both ends of the heat pipes 118 are coupled to a transversely-oriented evaporator section 134 that is thermally coupled to the heat pipes 118. While the embodiment shown in FIGS. 2 and 2A shows both loop heat pipes 126 being integrated into the same solar panel extension of the spacecraft 10, in other embodiments each loop heat pipe 126 may be associated with a different solar panel extension.

With reference to FIG. 2A, in some embodiments the extension or extensions 142 of the spacecraft 10 include a deck or decks 100 with one or more panels 122 (e.g., honeycomb panels) and one or more constant conductance heat pipes 118 (e.g., constant conductance heat pipes) disposed below the loop heat pipe 126. The extension or extensions 142 further include panels 122 (e.g. honeycomb panels) with OSR (optical solar reflectors) or paint disposed above the loop heat pipe 126, such that the loop heat pipe 126 is disposed between the deck or decks 100 and the panels 122. The additional heat pipes 118 in the extensions 142 help to spread heat and also help to protect the spacecraft 10 and the heat transfer system 14 from single point failure.

Figure 14:
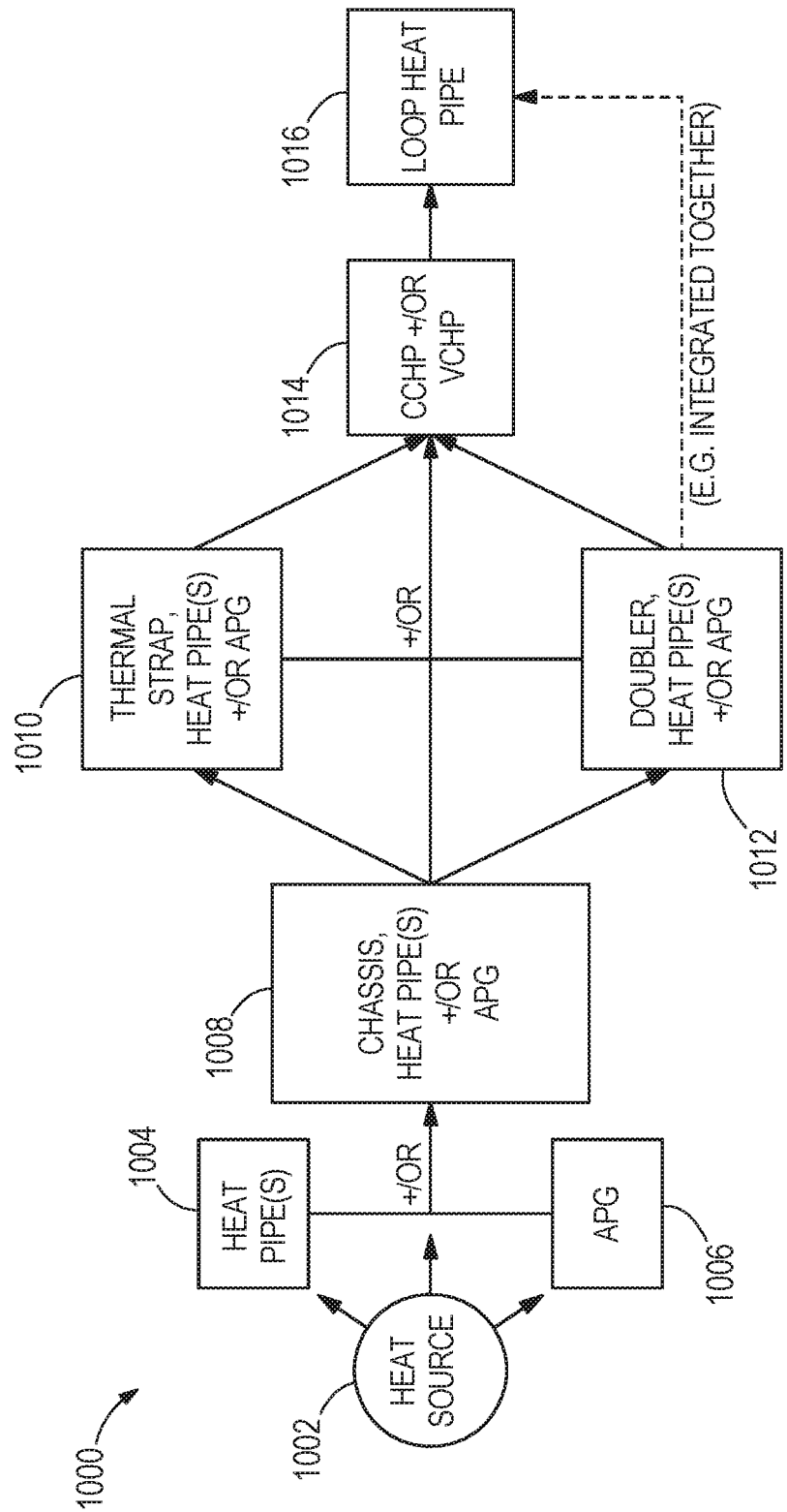
FIG. 14 is a flow diagram of a heat transfer system according to some embodiments of the present invention.

FIG. 14 shows a flow diagram of a heat transfer system 1000. The system 1000 includes a heat source 1002 (e.g., heat source 22). Heat from the heat source 1002 is transferred to a first heat spreader 1004 (e.g., the heat pipes 26) and/or to a second heat spreader 1006 (e.g., a component made of annealed pyrolytic graphite material such as K-Core®, for example the frame component 38). Heat is then transferred from the first and/or second heat spreaders 1004, 1006 to a third heat spreader 1008 (e.g., the chassis 50, a set of heat pipes, and/or a component made of annealed pyrolytic graphite material (APG) such as K-Core®). Heat then is transferred from the third second heat spreader 1008 to a fourth heat spreader 1010 (e.g., the thermal strap 90, a set of heat pipes, and/or a component made of annealed pyrolytic graphite material such as K-Core®) and/or to a fifth heat spreader 1012 (e.g., one of the doublers 86, 86', a set of heat pipes, and/or a component made of annealed pyrolytic graphite material such as K-Core®). Heat is then transferred from the fourth and/or fifth heat spreaders 1010, 1012 to a sixth heat spreader 1014 (e.g., the constant conductance and/or variable conductance heat pipes 118), and subsequently to a seventh heat spreader 1016 (e.g., the loop heat pipe 126). In some embodiments the fifth heat spreader 1012 and the seventh heat spreader 1014 are integrated together, as illustrated by the dashed line. In some embodiments the constant conductance and/or variable conductance heat pipes 118 radiate heat. In some embodiments the loop heat pipe 126 radiates heat. In some embodiments both the heat pipes 118 and the loop heat pipe 126 radiate heat.

Figure 15:
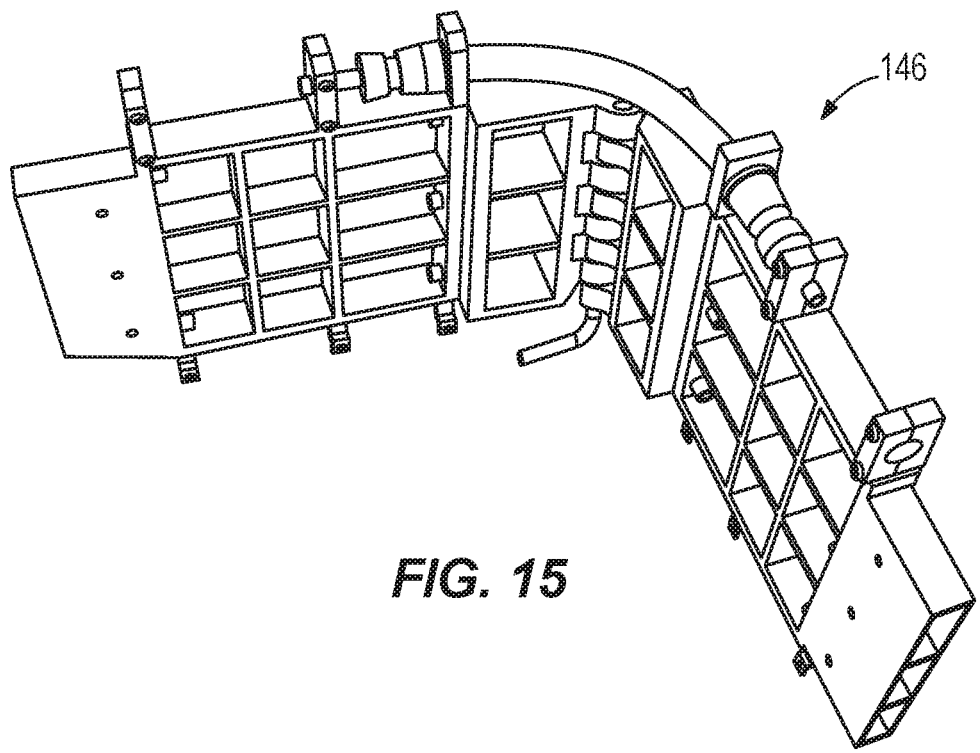
FIGS. 15-17 are perspective views of an embodiment of a hinge for use on the spacecraft of FIG. 1.
Figure 16:
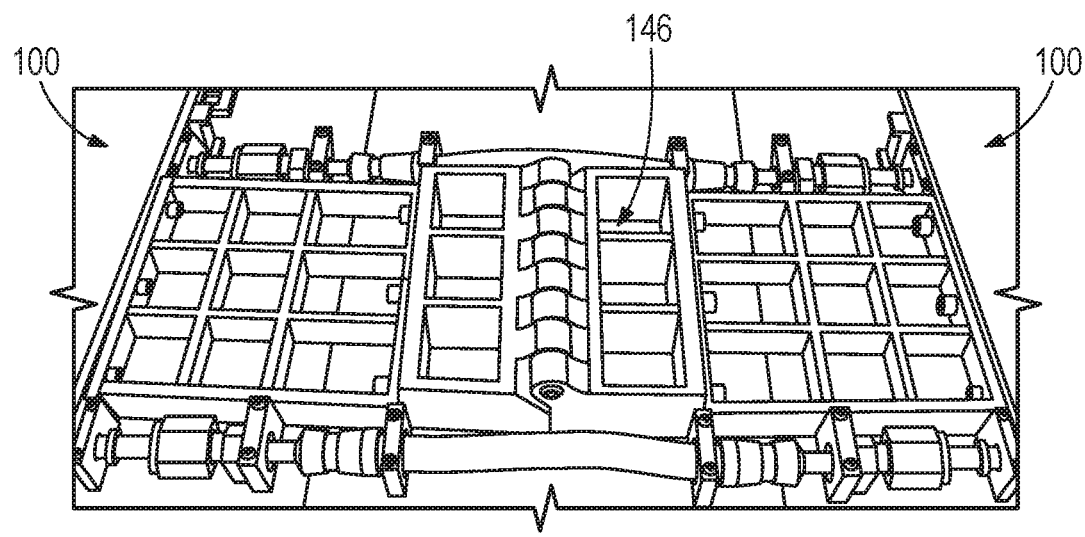
Figure 17:
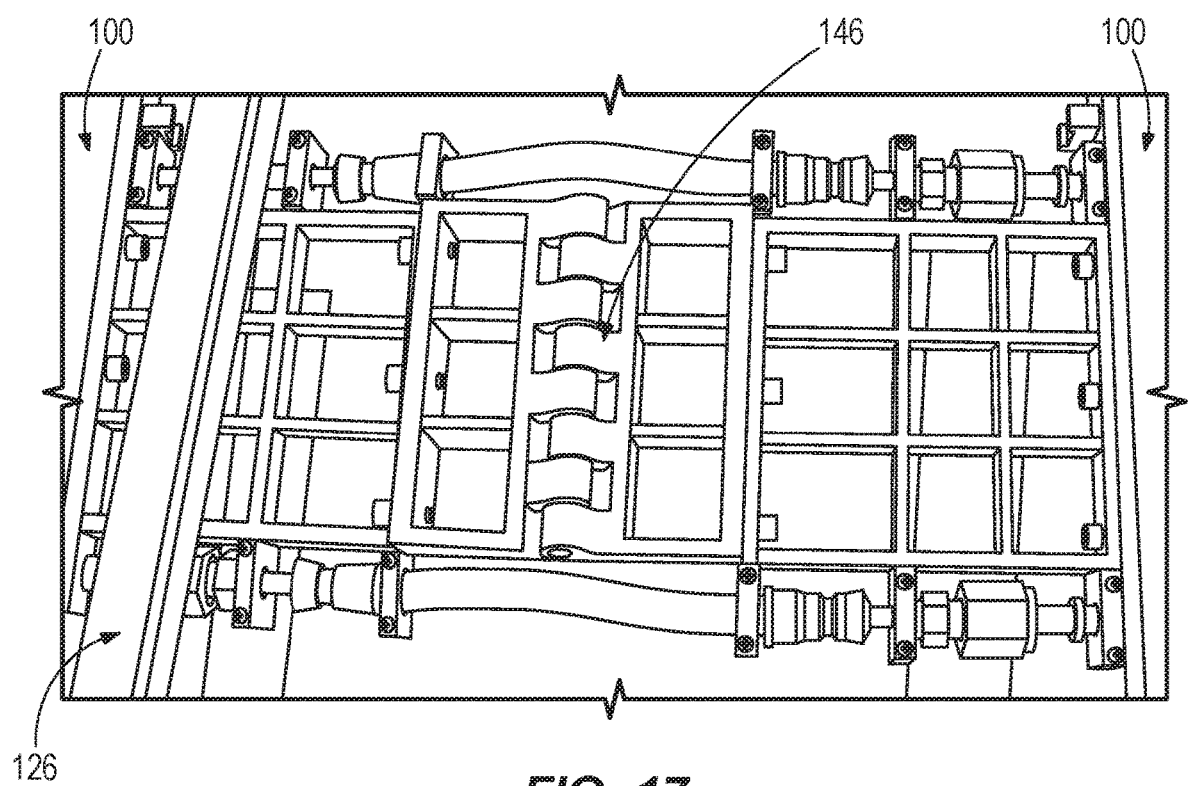

In some embodiments at least one of the components of the heat transfer system 14, 1000 described above is flexible or includes a flexible hinge element or elements that allow the component to fold and/or flex, so that the component may be initially confined in a small footprint and then deployed into a larger footprint when in use. This is particularly useful in the event that the heat transfer system 14, 1000 is being deployed into space, where the heat system 14, 1000 may initially be folded upon itself for launch and then deployed and expanded once out in space. In some embodiments at least one portion of the loop heat pipe 126 is flexible (e.g., includes a bellow, hinge, or other element that permits bending, or is otherwise made of a flexible material that permits bending) so that solar panels/heat dissipation panels can be folded during launch and unfolded when the spacecraft 10 is deployed. For example, with reference to FIGS. 15-17, in some embodiments the spacecraft 10 includes at least one hinge 146 disposed between adjacent decks 100 or other structures on the spacecraft such as the extensions 142, to facilitate folding and unfolding of the spacecraft 10. The hinge 146 includes a mechanical hinge component as well as a flexible heat pipe to facilitate transfer of liquids and/or vapors between the hingedly-connected components. For example, as disclosed in FIG. 2 and the associated text, the condenser portion 138 of the loop heat pipe 126 may be located in an extension 142 (which may also contain solar panels) and this extension 142 may be folded in a more compact arrangement during launch. Upon deployment of the spacecraft 10 the extension 142 can be unfolded, using the hinge 146 to control movement of the extension 142 while maintaining fluid-tight connections to the condenser portion 138 of the loop heat pipe 126.

In some embodiments, and as described above, a heat transfer system (e.g., such as the heat transfer system 14, 1000) includes a heat source, a first heat exchanger thermally coupled to the heat source to remove heat from the heat source, and a second heat exchanger thermally coupled to the first heat exchanger to remove heat from the first heat exchanger, the second heat exchanger including an electronics chassis that defines an opening to receive the heat source. The heat transfer system also includes at least one heat transfer device coupled to at least one wall of the electronics chassis, the heat transfer device selected from the group consisting of a heat pipe and an annealed pyrolytic graphite material.

In some embodiments, the first heat exchanger is selected from the group consisting of a heat pipe and an annealed pyrolytic graphite material. In some embodiments, the heat transfer system includes a thermal doubler coupled to the electronics chassis to remove heat from the electronics chassis. In some embodiments, the heat transfer system includes, in addition to the thermal doubler, a heat pipe coupled to the thermal doubler to remove heat from the thermal doubler. In some embodiments, the electronics chassis includes a side wall, and the side wall includes at least one heat pipe. In some embodiments, the electronics chassis includes, in addition to the side wall, a bottom wall, and the bottom wall also includes at least one heat pipe. In some embodiments, the electronics chassis includes, in addition to the side wall, a top wall, and the top wall also includes at least one heat pipe. In some embodiments, the electronics chassis includes a side wall, and the side wall includes a layer of annealed pyrolytic graphite. In some embodiments, the electronics chassis includes, in addition to the side wall having a layer of annealed pyrolytic graphite, a bottom wall, and the bottom wall also includes at least one heat pipe. In some embodiments, the electronics chassis includes, in addition to the side wall having a layer of annealed pyrolytic graphite, a top wall, and the top wall also includes at least one heat pipe. In some embodiments, a heat pipe is integrally formed with the at least one wall of the electronics chassis. In some embodiments, a layer of annealed pyrolytic graphite is integrally formed with the at least one wall of the electronics chassis. In some embodiments, the first heat exchanger is flexible. In some embodiments, the first heat exchanger, in addition to being flexible, includes a bellows. In some embodiments, the heat transfer system includes at least one flexible heat pipe.

Although the invention has been described in detail with reference to certain preferred embodiments, variations and modifications exist within the scope and spirit of one or more independent aspects of the invention as described.

What is claimed is:

1. A heat transfer system comprising:
a deck having a first heat pipe;
an electronics enclosure secured to the deck;
a heat-generating electronics device located within the electronics enclosure;
an encapsulated graphite material establishing thermal transfer from the heat-generating electronics device to a wall of the electronics enclosure; and
at least one of a second heat pipe, a second encapsulated graphite material, a thermal doubler, or a thermal strap establishing heat transfer from the electronics enclosure to the first heat pipe.

2. A heat transfer system comprising:
a heat source;
a first heat exchanger thermally coupled to the heat source to remove heat from the heat source;
a second heat exchanger thermally coupled to the first heat exchanger to remove heat from the first heat exchanger, the second heat exchanger including an electronics chassis that defines an opening to receive the heat source; and
at least one heat transfer device coupled to at least one wall of the electronics chassis, the heat transfer device selected from the group consisting of a heat pipe and an annealed pyrolytic graphite material;
wherein the electronics chassis includes a side wall and a top wall, each of which has at least one heat pipe.

3. The heat transfer system of claim 2, wherein the first heat exchanger is selected from the group consisting of a heat pipe and an annealed pyrolytic graphite material.

4. The heat transfer system of claim 2, further comprising a thermal doubler coupled to the electronics chassis to remove heat from the electronics chassis.

5. The heat transfer system of claim 4, further comprising a heat pipe coupled to the thermal doubler to remove heat from the thermal doubler.

6. The heat transfer system of claim 2, wherein the electronics chassis includes a bottom wall, and wherein the bottom wall also includes at least one heat pipe.

7. The heat transfer system of claim 2, wherein the electronics chassis includes a side wall, and wherein the side wall includes a layer of annealed pyrolytic graphite.

8. The heat transfer system of claim 7, wherein the electronics chassis includes a bottom wall, and wherein the bottom wall also includes at least one heat pipe.

9. The heat transfer system of claim 2, wherein a heat pipe is integrally formed with the at least one wall of the electronics chassis.

10. The heat transfer system of claim 2, wherein a layer of annealed pyrolytic graphite is integrally formed with the at least one wall of the electronics chassis.

11. The heat transfer system of claim 2, wherein the first heat exchanger is flexible.

12. The heat transfer system of claim 11, wherein the first heat exchanger includes a bellows.

13. The heat transfer system of claim 2, wherein the heat transfer system includes at least one flexible heat pipe.

14. A heat transfer system comprising:
a heat source;
a first heat exchanger thermally coupled to the heat source to remove heat from the heat source;
a second heat exchanger thermally coupled to the first heat exchanger to remove heat from the first heat exchanger, the second heat exchanger including an electronics chassis that defines an opening to receive the heat source; and
at least one heat transfer device coupled to at least one wall of the electronics chassis, the heat transfer device selected from the group consisting of a heat pipe and an annealed pyrolytic graphite material;
wherein the electronics chassis includes a side wall, and wherein the side wall includes a layer of annealed pyrolytic graphite.

15. The heat transfer system of claim 14, wherein the electronics chassis includes a bottom wall, and wherein the bottom wall also includes at least one heat pipe.

16. The heat transfer system of claim 14, wherein the electronics chassis includes a top wall, and wherein the top wall also includes at least one heat pipe.

17. A heat transfer system comprising:
a heat source;
a first heat exchanger thermally coupled to the heat source to remove heat from the heat source;
a second heat exchanger thermally coupled to the first heat exchanger to remove heat from the first heat exchanger, the second heat exchanger including an electronics chassis that defines an opening to receive the heat source; and
at least one heat transfer device coupled to at least one wall of the electronics chassis, the heat transfer device selected from the group consisting of a heat pipe and an annealed pyrolytic graphite material;
wherein a layer of annealed pyrolytic graphite is integrally formed with the at least one wall of the electronics chassis.

18. A heat transfer system comprising:
a heat source;
a first heat exchanger thermally coupled to the heat source to remove heat from the heat source;
a second heat exchanger thermally coupled to the first heat exchanger to remove heat from the first heat exchanger, the second heat exchanger including an electronics chassis that defines an opening to receive the heat source; and
at least one heat transfer device coupled to at least one wall of the electronics chassis, the heat transfer device selected from the group consisting of a heat pipe and an annealed pyrolytic graphite material;
wherein the first heat exchanger is flexible, and includes a bellows.

* * * * *